United States Patent
Guan et al.

(10) Patent No.: US 11,747,418 B2
(45) Date of Patent: *Sep. 5, 2023

(54) FLEXIBLE RADIO FREQUENCY COIL FOR MAGNETIC RESONANCE IMAGING

(71) Applicant: CANON MEDICAL SYSTEMS CORPORATION, Tochigi (JP)

(72) Inventors: Yiping Guan, Aurora, OH (US); Yoshinori Hamamura, Moreland Hills, OH (US)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/718,825

(22) Filed: Apr. 12, 2022

(65) Prior Publication Data

US 2022/0236351 A1 Jul. 28, 2022

Related U.S. Application Data

(63) Continuation of application No. 15/930,237, filed on May 12, 2020, now Pat. No. 11,327,131.

(51) Int. Cl.
*G01R 33/3875* (2006.01)
*G01R 33/34* (2006.01)

(52) U.S. Cl.
CPC ... *G01R 33/3875* (2013.01); *G01R 33/34046* (2013.01)

(58) Field of Classification Search
None
See application file for complete search history.

(56) References Cited

U.S. PATENT DOCUMENTS

| | | | |
|---|---|---|---|
| 4,621,237 A | 11/1986 | Timms | |
| 6,847,210 B1 | 1/2005 | Eydelman | |
| 6,980,000 B2 | 12/2005 | Wong | |
| 8,963,547 B2 | 2/2015 | Tsujita | |
| 9,678,180 B2 | 6/2017 | Yang | |
| 9,864,025 B2 | 1/2018 | Han | |
| 11,327,131 B2 * | 5/2022 | Guan | G01R 33/34007 |
| 2012/0153955 A1 | 6/2012 | Wong | |
| 2018/0372817 A1 | 12/2018 | Rahmat-Samii | |
| 2020/0348380 A1 | 11/2020 | Taracila | |

FOREIGN PATENT DOCUMENTS

| | | |
|---|---|---|
| WO | 2014003918 A1 | 1/2014 |
| WO | 2018098248 A1 | 5/2018 |

OTHER PUBLICATIONS

Robert Stormont et al., Reimagining Flexible Coil Technology, gesignapulse.com, Apr. 2017.
Weihua Mao et al., Exploring the Limits of RF Shimming for High-Field MRI of the Human Head, Magnetic Resonance in Medicine 56:918-922 (2006), Sep. 2006.

* cited by examiner

*Primary Examiner* — Rodney E Fuller
(74) *Attorney, Agent, or Firm* — Canon U.S.A., Inc. IP Division

(57) ABSTRACT

Some radio-frequency coils comprise three or more electrical conductors that form a radio-frequency coil element. Each of the three or more electrical conductors extends along at least a respective part of a length of the radio-frequency coil element, and, along the length of the radio-frequency coil element, the three or more electrical conductors are separated from each other by respective distances and by one or more dielectric materials.

23 Claims, 26 Drawing Sheets

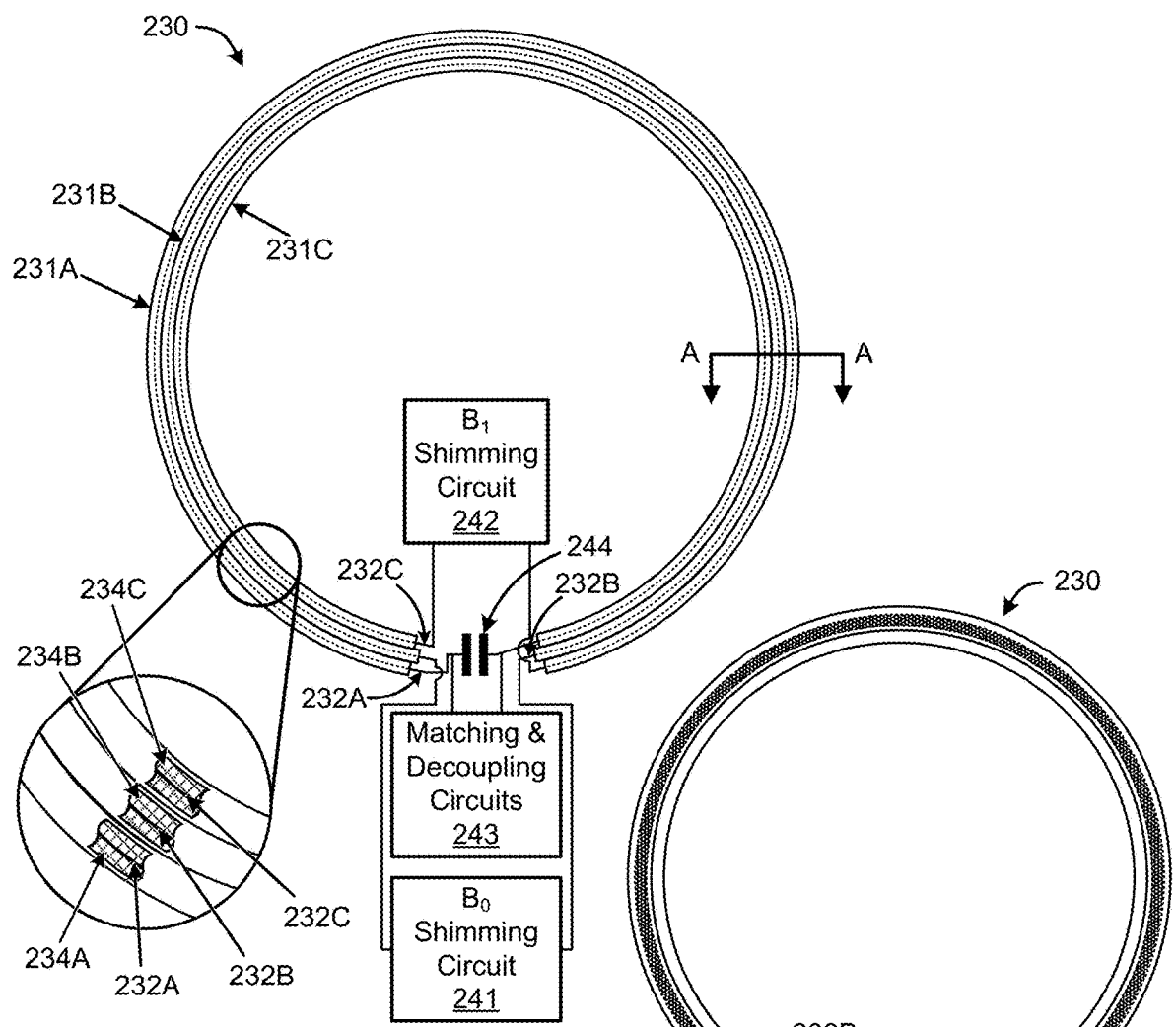
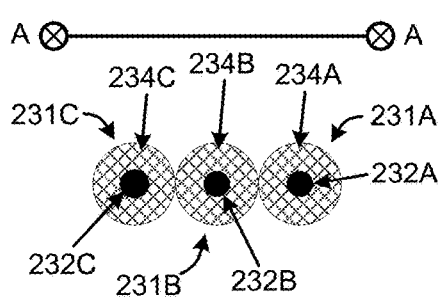
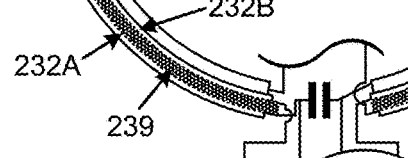
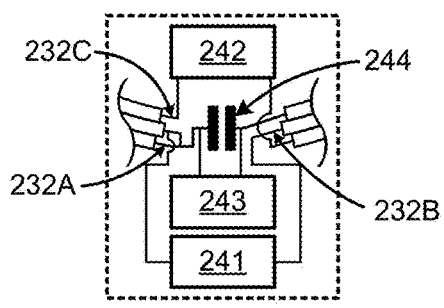

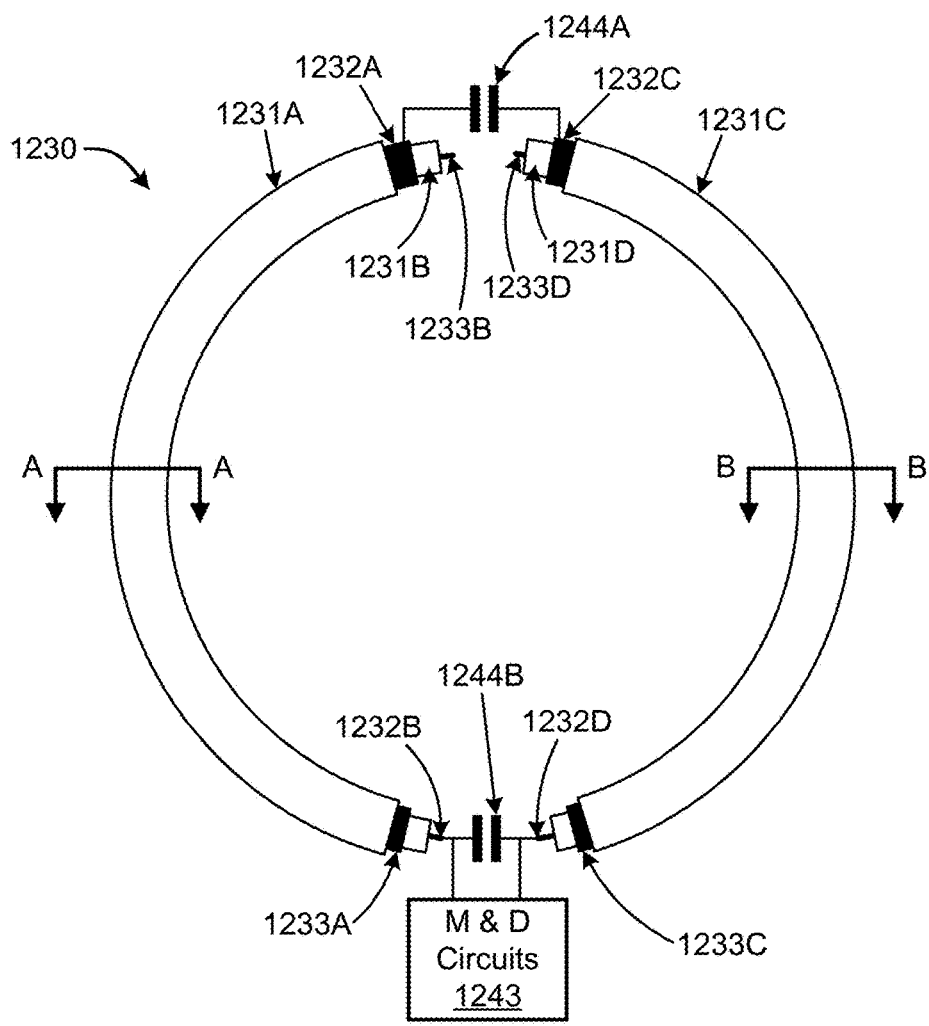
FIG. 12A
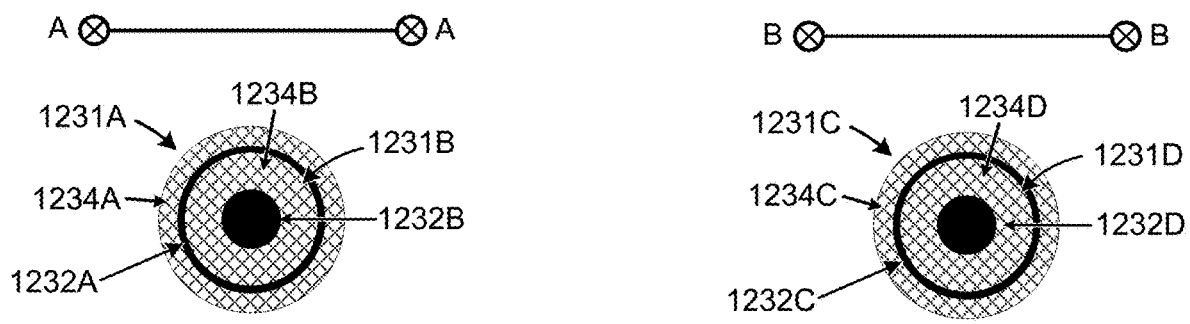
FIG. 12B     FIG. 12C

FLEXIBLE RADIO FREQUENCY COIL FOR MAGNETIC RESONANCE IMAGING

CROSS-REFERENCE TO RELATED APPLICATIONS

This application is a continuation of U.S. Application No. 15/930,237, which was filed on May 12, 2020.

BACKGROUND

Technical Field: This application generally concerns radio frequency (RF) coils for magnetic resonance imaging (MRI).

Background: MRI is an imaging modality that uses magnetic fields and RF energy to create images of the interior of an object (e.g., a human patient) without using X-rays or other ionizing radiation. MRI scanners include a main magnet, which produces a static magnetic field (the $B_0$ field) that polarizes an object. Also, as pulses of RF energy are transmitted through the object, the RF pulses may produce other magnetic fields ($B_1$ fields). MRI scanners can use $B_0$ shimming coils to improve the static magnetic field homogeneity and use $B_1$ shimming techniques to enhance the RF transmit field's uniformity.

SUMMARY

Some embodiments of a radio-frequency coil for magnetic resonance imaging comprise three or more electrical conductors that form an RF coil element. Each of the three or more electrical conductors extends along at least a respective part of a length of the radio-frequency coil element, and, along the length of the RF coil element, the three or more electrical conductors are separated from each other by respective distances and by one or more dielectric materials. Furthermore, in some embodiments, along at least part of a length of the radio-frequency coil element, the three or more electrical conductors are locally parallel to each other. And, in some embodiments, the three or more electrical conductors are arranged such that a capacitance is generated between any two of the three or more electrical conductors. Adjusting any electrical conductor's length (e.g., if one end of the electrical conductor is not connected) or adjusting the distance between any two electrical conductors changes the distributed capacitance and allows the RF coil element to be tuned to a desired resonant frequency.

Some embodiments of an RF coil comprise three or more transmission lines that form an RF coil element. Each of the three or more transmission lines extends along at least part of a length of the RF coil element, and, along the part of the length of the RF coil element, the three or more transmission lines are separated from each other by respective distances and by one or more dielectric materials.

Some embodiments of a radio-frequency circuit comprise three or more electrical conductors that form an RF coil element and one or more dielectric materials. Along at least part of a length of the RF coil element, the three or more electrical conductors are separated from each other by the one or more dielectric materials. Also, the length of the RF coil element and the one or more dielectric materials are configured such that the RF coil element is configured to generate a magnetic field for $B_0$ shimming or to generate a magnetic field for $B_1$ shimming.

Some embodiments of a radio-frequency circuit comprise two or more electrical conductors that form a coil, wherein, along a length of the coil, the two or more electrical conductors are separated from each other by respective distances, wherein, across at least some of the respective distances, the two or more electrical conductors are separated from each other by one or more dielectric materials, and wherein the length of the coil, the respective distances, and the one or more dielectric materials are configured such that the coil is configured to generate a magnetic field for $B_0$ shimming or to generate a magnetic field for $B_1$ shimming.

BRIEF DESCRIPTION OF THE DRAWINGS

FIG. 2A illustrates an example embodiment of a radio-frequency ("RF") coil.

FIG. 2B illustrates a cross-sectional view of the RF coil of FIG. 2A taken from the line A-A.

FIG. 2C illustrates one area of overlapping capacitance in the RF coil of FIG. 2A.

FIG. 2D illustrates another example embodiment of the connections between the members of the RF coil of FIG. 2A.

FIG. 12A illustrates an example embodiment of an RF coil.

FIG. 12B illustrates a cross-sectional view of the RF coil of FIG. 12A taken from the line A-A.

FIG. 12C illustrates a cross-sectional view of the RF coil of FIG. 12A taken from the line B-B.

DESCRIPTION

The following paragraphs describe certain explanatory embodiments. Other embodiments may include alternatives, equivalents, and modifications. Additionally, the explanatory embodiments may include several novel features, and a particular feature may not be essential to some embodiments of the devices, systems, and methods that are described herein.

Figure 1A:
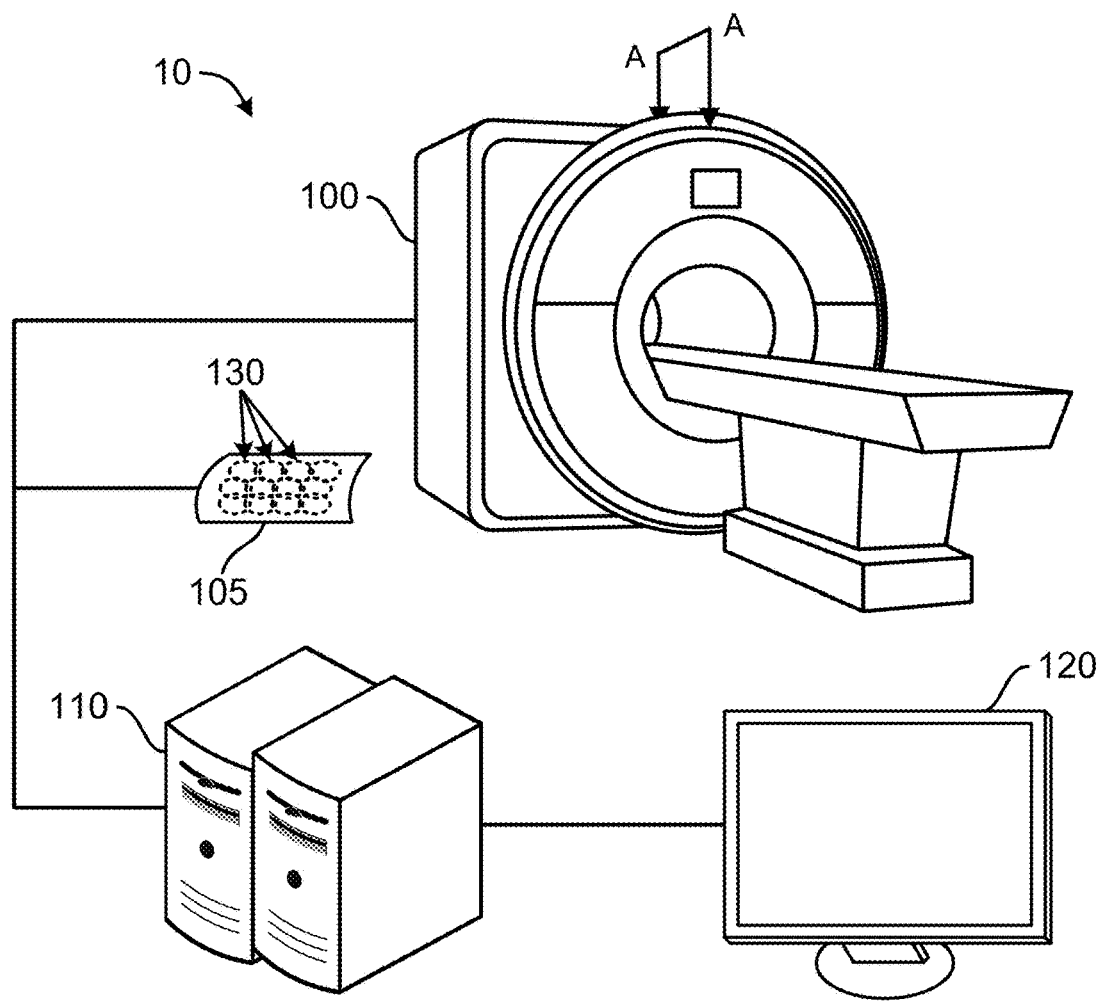
FIG. 1A illustrates an example embodiment of a medical-imaging system.

FIG. 1A illustrates an example embodiment of a medical-imaging system 10. The medical-imaging system 10 includes at least one magnetic-resonance-imaging ("MRI") device 100; one or more image-generation devices 110, each of which is a specially-configured computing device (e.g., a specially-configured desktop computer, a specially-configured laptop computer, a specially-configured server); and a display device 120.

The MRI device 100 is configured to acquire scan data by scanning a region (e.g., area, volume, slice) of an object (e.g., a patient) using magnetic resonance imaging. The one or more image-generation devices 110 obtain scan data from the MRI device 100 and generate an image of the region of the object based on the scan data. After the one or more image-generation devices 110 generate the image, the one or more image-generation devices 110 send the image to the display device 120, which displays the image.

Figure 1B:
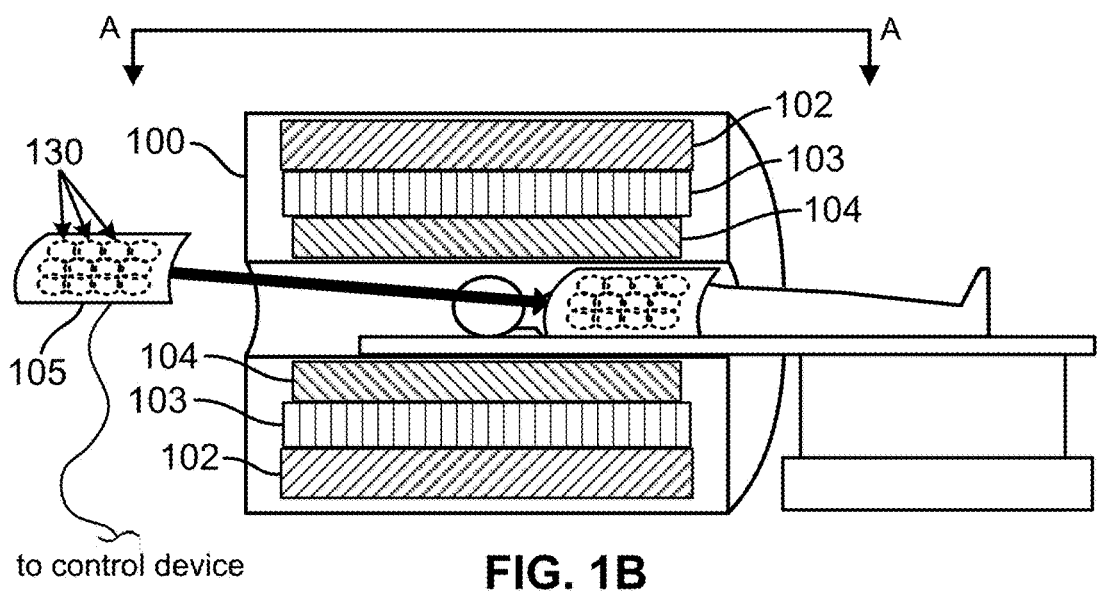
FIG. 1B illustrates a cutaway view of an example embodiment of the MRI device in FIG. 1A along the line A-A.

FIG. 1B illustrates a cutaway view of an example embodiment of the MRI device 100 along the line A-A in FIG. 1A. The MRI device 100 houses a main magnet 102 that generates a static magnetic field ($B_0$ magnetic field). The main magnet 102 has a hollow, cylindrical shape. The MRI device 100 also includes gradient coils 103 and may include one or more RF whole-body coils 104, and the MRI device 100 may house the gradient coils 103 and the RF whole-body coils 104 (e.g., on the inner perimeter of the main magnet 102). And, in addition to the RF whole-body coils 104 included in the MRI device 100, one or more RF coils 130 (e.g., phased array coils, surface coils) may be contained in another coil-holding device 105 or housing, such as a blanket, a cover, or a shield that is placed on a patient. The MRI device 100 or another specially-configured computing device can act as a control device of the RF coils 130.

RF coils include RF transmit coils, RF receive coils, and RF transmit-receive coils. An RF transmit coil generates an RF pulse that produces a $B_1$ magnetic field that is perpendicular to the $B_0$ magnetic field, which rotates the net magnetization away from an alignment with the $B_0$ magnetic field, resulting in a transverse precessing magnetization. The RF transmit coils may be configured to oscillate the $B_1$ magnetic field at a Larmor Frequency $\omega_r$, resulting in a precessing magnetization that creates a transverse magnetic field. The Larmor Frequency $\omega_r$ depends on the mass of the precessing system (e.g., the atomic nuclei of the materials that compose a scanned object) and on the strength of the $B_0$ magnetic field.

An RF receive coil detects the precessing magnetization caused by the $B_1$ magnetic field via electromagnetic induction that produces an induced electromotive force (EMF). The detected induced EMF may be used as the scan data, or the scan data may be otherwise based on the detected induced EMF. Also, an RF transmit-receive coil combines the functions of an RF transmit coil and an RF receive coil.

RF receive coils, RF transmit coils, and RF transmit-receive coils are resonant circuits (e.g., LC resonant circuits) that include tuned electrical components. A tuned RF coil has a capacitance (C) (and sometimes an inductance (L) as well as a capacitance) that is configured such that the resonance frequency of the RF coil matches a desired frequency (e.g., the frequency of the nuclear magnetic resonance of the spins in the materials that compose a patient's tissue). At the resonance frequency, a small external perturbation caused by the precessing magnetization produces a large response from the RF coil.

FIG. 2A illustrates an example embodiment of an RF coil. The RF coil 230 includes three dielectric-wrapped conductors 231A-C (e.g., jacketed conductors) that compose an RF coil element. Each dielectric-wrapped conductor 231A-C includes a respective electrical conductor (e.g., transmission line). Thus, the RF coil 230 includes three electrical conductors 232A-C (collectively, "electrical conductors 232") that are arranged such that locally they are in parallel (or such that the distance between the two closest parts of two electrical conductors is constant or approximately constant over the lengths of the electrical conductors 232) and such that they form a closed RF loop. For example, the electrical conductors 232 may be copper wires, one or more copper layers on top or bottom of a flexible PCB substrate, one or more copper layers sandwiched between thin layers of polyimide or dielectric material, copper traces, or other conducting materials. In this embodiment and in the other embodiments that are described herein, at least some of the gauges (cross-sectional diameters) of the electrical conductors 232 may be the same, or the gauges may all be different from each other. Also, an electrical conductor 232 may be composed of multiple smaller conductors (e.g., multiple intertwined wires).

In this embodiment, each of the electrical conductors 232 is wrapped in (e.g., jacketed by, surrounded by) a respective dielectric material 234A-C (collectively, "dielectric materials 234"). At least some of the first dielectric material 234A, the second dielectric material 234B, and the third dielectric material 234C may be the same dielectric material, or they may all be different from each other. FIG. 2B illustrates a cross-sectional view of the RF coil 230 of FIG. 2A taken from the line A-A.

The ends of the electrical conductors 232 are coupled (e.g., connected) to one or more of the following: a $B_0$ shimming circuit 241, a $B_1$ shimming circuit 242, matching and decoupling circuits 243, and at least one capacitor 244. This example embodiment of an RF coil 230 has only a single breakpoint capacitor 244. In this embodiment, the first electrical conductor 232A has (i) a first end that is connected to the capacitor 244 and to the matching and decoupling circuits 243 and (ii) a second end that is connected to the $B_1$ shimming circuit 242. The second electrical conductor 232B has (i) a first end that is connected to the $B_0$ shimming circuit 241 and (ii) a second end that is connected to the $B_0$ shimming circuit 241. And the third electrical conductor 232C has (i) a first end that is connected to the $B_1$ shimming circuit 242 and (ii) a second end that is connected to the capacitor 244 and to the matching and decoupling circuits 243.

Although, over the length of the RF coil 230, the dielectric materials 234 maintain some electrical separation of the electrical conductors 232, the electrical conductors 232 have overlapping capacitances. For example, FIG. 2C illustrates one area of overlapping capacitance in the RF coil 230 of FIG. 2A. Because the first electrical conductor 232A is separated from the second electrical conductor 232B by a dielectric material and overlaps the second electrical conductor 232B along the length of the RF coil 230 (e.g., the circumference of the RF coil 230, the perimeter of the RF coil 230), the first electrical conductor 232A and the second electrical conductor 232B produce an overlapping capacitance in an overlap area 239. The overlapping capacitances between the electrical conductors 232 can act as one or more additional breakpoint capacitors along the length of the RF coil 230.

If wire A with a radius $r_a$ and wire B with a radius $r_b$ are parallel and are separated by a distance D, the capacitance C between wire A and wire B can be described by $$C = \frac{2\pi\varepsilon L}{\ln\left[\frac{(D-r_a)(D-r_b)}{r_a r_b}\right]}, \quad (1)$$

where $\varepsilon$ is the permittivity, and where L is the length of the overlap. And, when $D \gg r_a$ and $r_b$, $$C = \frac{2\pi\varepsilon L}{\ln\left[\frac{D^2}{r_a r_b}\right]}. \quad (2)$$

The parameters of the RF coil 230, the first electrical conductor 232A, the second electrical conductor 232B, and the dielectric materials 234 can be selected to tune the RF coil 230 by configuring the overlapping capacitances between the electrical conductors 232. Examples of parameters include the size (e.g., diameter) of the RF coil 230, the shape of the RF coil 230, the distances between the electrical conductors 232, the materials that compose the electrical conductors 232, the cross-sectional diameters (gauges) of the electrical conductors 232, the lengths of the electrical conductors 232, the lengths of the overlap of the electrical conductors 232, the materials that compose the dielectric materials 234, the thicknesses of the dielectric materials 234, and the capacitance of the capacitor 244.

A switching circuit (e.g., a switching circuit in a control device) can enable or otherwise activate the $B_0$ shimming circuit 241, the $B_1$ shimming circuit 242, and the matching and decoupling circuits 243. When active (e.g., when supplying a current or a voltage to the RF coil 230), the $B_0$ shimming circuit 241 causes the RF coil 230 to produce a magnetic field that compensates for variations in the $B_0$ magnetic field. When active, the $B_1$ shimming circuit 242 causes the RF coil 230 to perform a $B_1$ shim. Furthermore, some embodiments of the RF coil 230 and the other RF coils that are described herein do not include the $B_0$ shimming circuit 241, do not include the $B_1$ shimming circuit 242, or do not include either the $B_0$ shimming circuit 241 or the $B_1$ shimming circuit 242.

Also, when active, some embodiments of the matching and decoupling circuits 243 cause the RF coil to act as one or more of the following: an RF transmit coil, an RF receive coil, and an RF transmit-receive coil. Moreover, some embodiments of the RF coil 230 and the other RF coils that are described herein are configured to operate as only a transmit coil, and some embodiments of the RF coil 230 and the other RF coils that are described herein are configured to operate as only a receive coil. And the matching and decoupling circuits 243 may be used for impedance matching or noise matching the RF coil 230 to other circuitry (e.g., an amplifier, such as a Low Noise Amplifier). Additionally, in an array of RF coils 230 (e.g., the arrays shown in FIGS. 15A-15H), the matching and decoupling circuits 243 decouple (e.g., reduce the coupling caused by mutual inductance) the RF coils 230 in the array.

FIG. 2D illustrates another example embodiment of the connections between the members of the RF coil of FIG. 2A. In this embodiment, one side of the capacitor 244 is connected to both a first electrical conductor 232A and a second electrical conductor 232B, and the other side of the capacitor 244 is connected to only a third electrical conductor 232C.

Also, RF coils may have other configurations, as shown by the following embodiments.

Figure 3A:
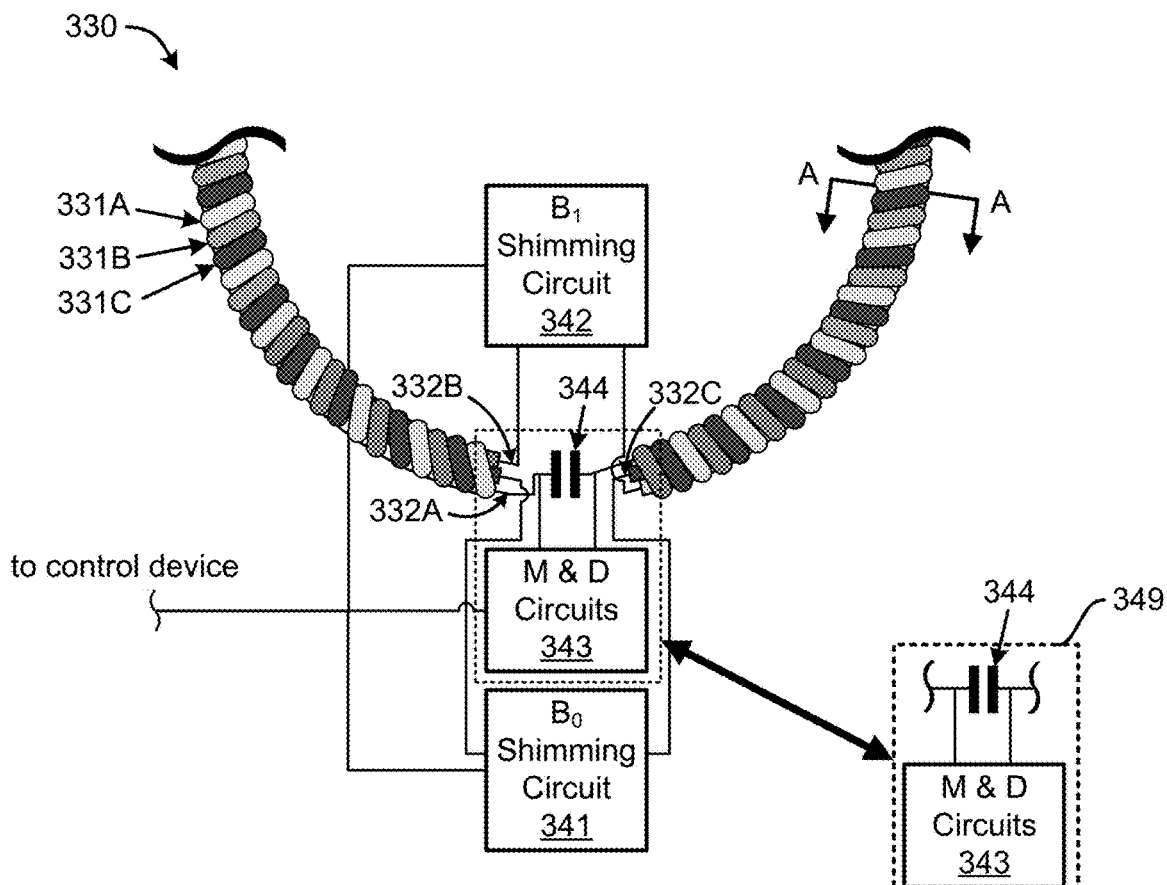
FIG. 3A illustrates an example embodiment of an RF coil.
Figure 3B:
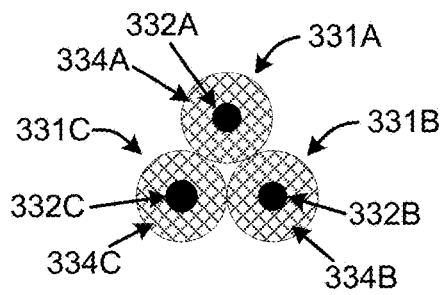
FIG. 3B illustrates a cross-sectional view of the RF coil of FIG. 3A taken from the line A-A.

FIG. 3A illustrates an example embodiment of an RF coil, and FIG. 3B illustrates a cross-sectional view of the RF coil of FIG. 3A taken from the line A-A. Although the RF coil 330 forms a loop (like the RF coil 230 in FIG. 2A), FIG. 3A does not show the half of the RF coil 330 that is opposite to the capacitor 344.

This embodiment is similar to the embodiment shown in FIG. 2A, but the dielectric-wrapped conductors 331A-C are twisted together or otherwise intertwined (e.g., in the form of a triple helix). Thus, the cross-sectional view of the RF coil 330 is different. In some other embodiments of the RF coil in FIG. 3A, the dielectric-wrapped conductors 331A-C are not intertwined, but have a cross section that is similar or identical to the cross section in FIG. 3B.

The intertwining of the dielectric-wrapped conductors 331A-C is also a parameter that can be adjusted to tune the RF coil 330. The dielectric-wrapped conductors 331A-C include respective electrical conductors 332A-C and a respective dielectric material 334A-C. At least some of the respective dielectric materials 334A-C may be the same, or they may all be different from each other. Although the electrical conductors 332A-C are intertwined, the distance between the two closest parts of any two of the electrical conductors 332A-C may be constant or nearly constant over the lengths of the electrical conductors 332A-C.

The ends of the electrical conductors 332A-C are connected to one or more of the following: a $B_0$ shimming circuit 341, a $B_1$ shimming circuit 342, matching and decoupling circuits 343, and a capacitor 344. In this embodiment, the first electrical conductor 332A has (i) a first end that is connected to the capacitor 344 and to the matching and decoupling circuits 343 and (ii) a second end that is connected to the $B_1$ shimming circuit 342. The second electrical conductor 332B has (i) a first end that is connected to the $B_1$ shimming circuit 342 and (ii) a second end that is connected to the capacitor 344 and to the matching and decoupling circuits 343. And the third electrical conductor 332C has (i) a first end that is connected to the $B_0$ shimming circuit 341 and (ii) a second end that is connected to the $B_0$ shimming circuit 341.

Figure 3C:
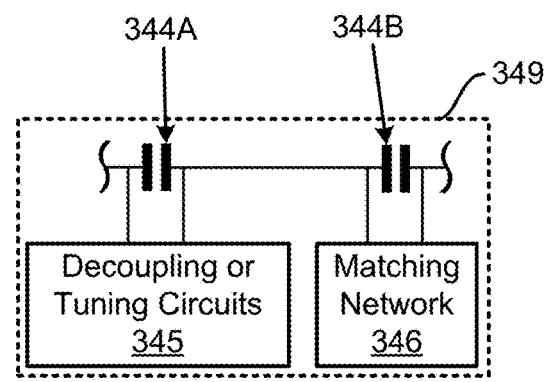
FIG. 3C illustrates an example embodiment of the circuitry of an RF coil.

Also, other embodiments of the RF coil 330 may have different configurations of the capacitor 344 and the matching and decoupling circuits 343, which are shown in box 349. FIG. 3C illustrates an example embodiment of the circuitry of an RF coil. This circuitry shows another embodiment of the circuitry that is shown in the box 349. This embodiment includes decoupling or tuning circuits 345 that are separate from a matching network 346, which includes matching circuitry. Also, this embodiment includes two capacitors 344A-B. Furthermore, this embodiment of the circuitry in the box 349 may be used with other embodiments of the RF coil 330 (e.g., the other embodiments that are described herein).

Additionally, in this embodiment and the other embodiments that are described herein, the $B_0$ shimming circuit 341, the $B_1$ shimming circuit 342, and the matching and decoupling circuits 343 are coupled to a control device (e.g., a MRI device, a specially-configured computing device), which controls their operation.

Figure 4A:
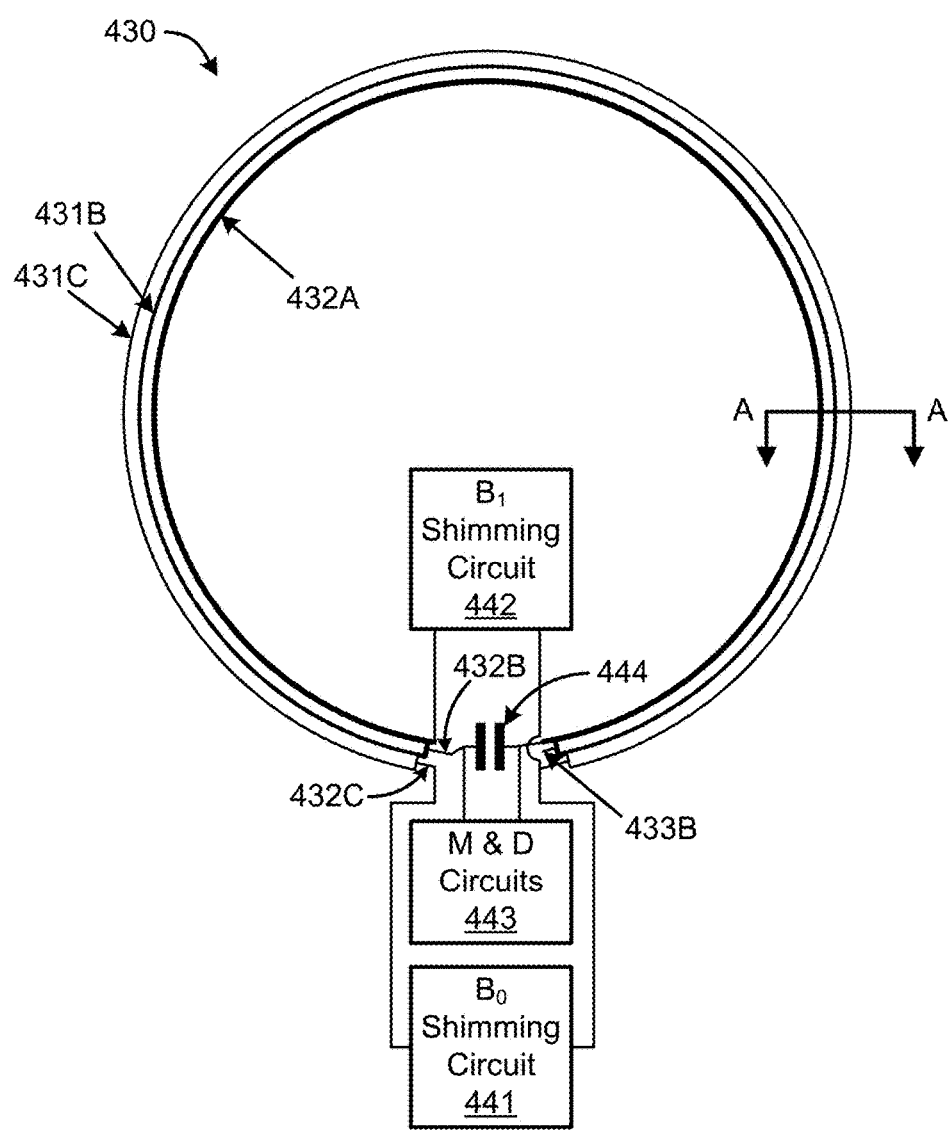
FIG. 4A illustrates an example embodiment of an RF coil.
Figure 4B:
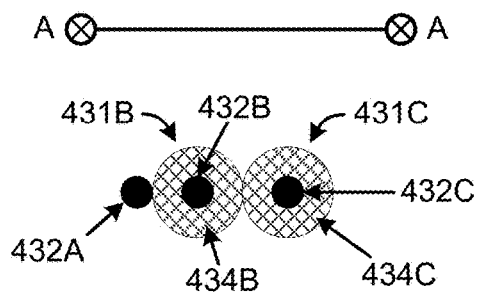
FIG. 4B illustrates a cross-sectional view of the RF coil of FIG. 4A taken from the line A-A.

FIG. 4A illustrates an example embodiment of an RF coil, and FIG. 4B illustrates a cross-sectional view of the RF coil of FIG. 4A taken from the line A-A. The RF coil 430 includes two dielectric-wrapped conductors 431B-C and another electrical conductor 432A that is not wrapped in a dielectric. The two dielectric-wrapped conductors 431B-C and the other electrical conductor 432A form an RF coil element. Also, each dielectric-wrapped conductor 431B-C includes a respective electrical conductor 432B-C and a respective dielectric material 434B-C. The respective dielectric materials 434B-C may be the same dielectric material, or they may be different from each other. Thus, the RF coil 430 includes three electrical conductors 432A-C that form a closed RF loop.

One of the electrical conductors 432B has an unconnected end 433B (e.g., a floating end). The length of the electrical conductor 432B that has the unconnected end 433B can be adjusted, and this adjustment can be used to tune the RF coil 430.

The other ends of the electrical conductors 432A-C are connected to one or more of the following: a $B_0$ shimming circuit 441, a $B_1$ shimming circuit 442, matching and decoupling circuits 443, and a capacitor 444. In this embodiment, the first electrical conductor 432A has (i) a first end that is connected to the $B_1$ shimming circuit 442 and (ii) a second end that is connected to the capacitor 444 and to the matching and decoupling circuits 443. The second electrical conductor 432B has (i) a first end that is connected to the capacitor 444 and to the matching and decoupling circuits 443 and (ii) an unconnected end 433B. And the third electrical conductor 432C has (i) a first end that is connected to the $B_0$ shimming circuit 441 and (ii) a second end that is connected to the $B_0$ shimming circuit 441 and to the $B_1$ shimming circuit 442.

Figure 4C:
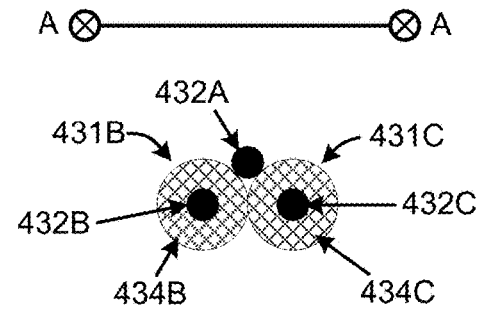
FIG. 4C illustrates the cross-sectional view of another embodiment of the RF coil of FIG. 4A taken from the line A-A.

FIG. 4C illustrates the cross-sectional view of another embodiment of the RF coil of FIG. 4A taken from the line A-A. In this embodiment, the electrical conductor 432 that is not wrapped in a dielectric is positioned such that it is equidistant or approximately equidistant to the other two electrical conductors 432.

Figure 5A:
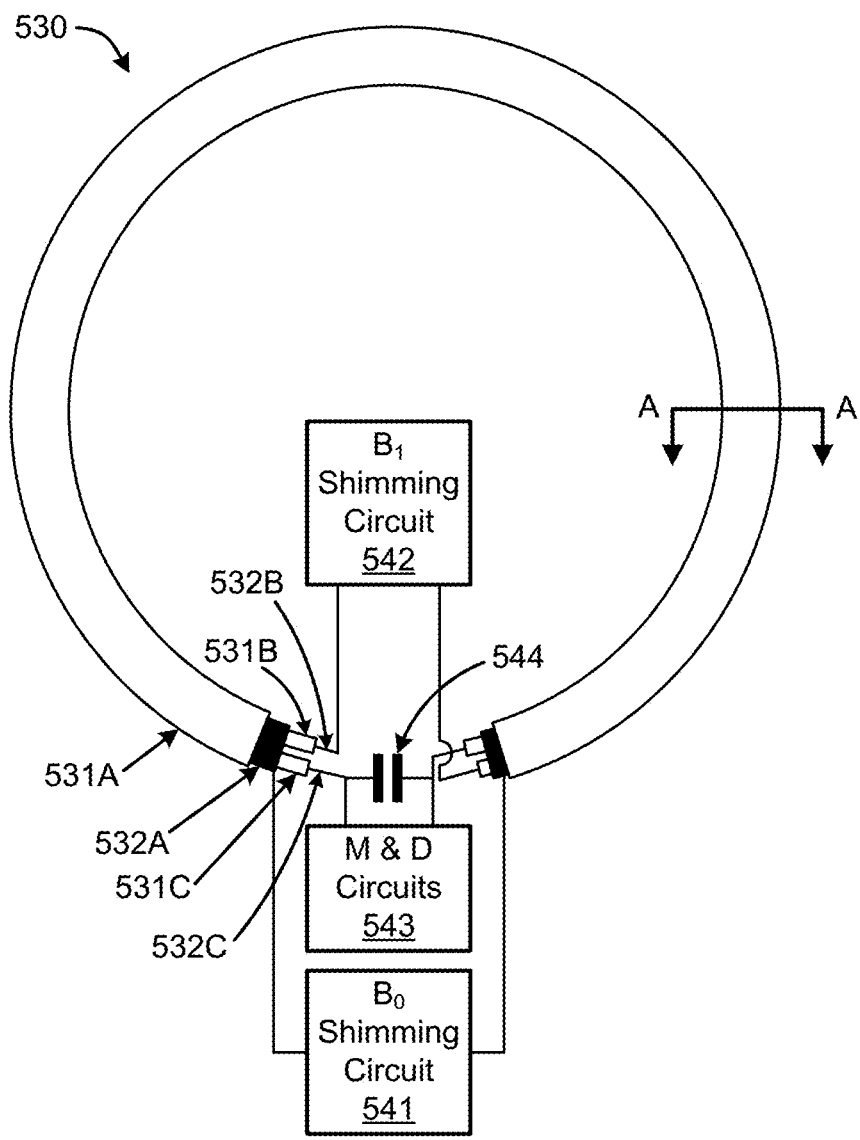
FIG. 5A illustrates an example embodiment of an RF coil.
Figure 5B:
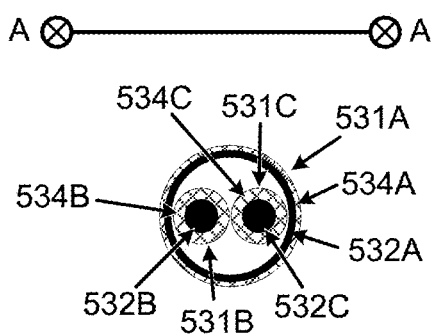
FIG. 5B illustrates a cross-sectional view of the RF coil of FIG. 5A taken from the line A-A.

FIG. 5A illustrates an example embodiment of an RF coil, and FIG. 5B illustrates a cross-sectional view of the RF coil of FIG. 5A taken from the line A-A. The RF coil 530 includes three dielectric-wrapped conductors: a first dielectric-wrapped conductor 531A, a second dielectric-wrapped conductor 531B, and a third dielectric-wrapped conductor 531C (collectively, the "dielectric-wrapped conductors 531") that compose an RF coil element. The dielectric-wrapped conductors 531 are arranged in a twin axial (twinax) configuration. Thus, the first dielectric-wrapped conductor 531A includes an electrical conductor 532A (e.g., formed in a braided weave) that surrounds the second dielectric-wrapped conductor 531B and the third dielectric-wrapped conductor 531C. Also, the second dielectric-wrapped conductor 531B and the third dielectric-wrapped conductor 531C include respective electrical conductors 532B-C that are each surrounded by a respective dielectric material 534B-C. At least some of the first dielectric material 534A, the second dielectric material 534B, and the third dielectric material 534C may be the same dielectric material, or they may all be different from each other. Therefore, the RF coil 530 includes three electrical conductors 532A-C that form a closed RF loop.

The ends of the electrical conductors 532A-C are connected to one or more of the following: a $B_0$ shimming circuit 541, a $B_1$ shimming circuit 542, matching and decoupling circuits 543, and a capacitor 544. In this embodiment, the first electrical conductor 532A has (i) a first end that is connected to the $B_0$ shimming circuit 541 and (ii) a second end that is connected to the $B_0$ shimming circuit 541. The second electrical conductor 532B has (i) a first end that is connected to the $B_1$ shimming circuit 542 and (ii) a second end that is connected to the capacitor 544 and to the matching and decoupling circuits 543. And the third electrical conductor 532C has (i) a first end that is connected to the capacitor 544 and to the matching and decoupling circuits 543 and (ii) a second end that is connected to the $B_1$ shimming circuit 542.

Figure 6:
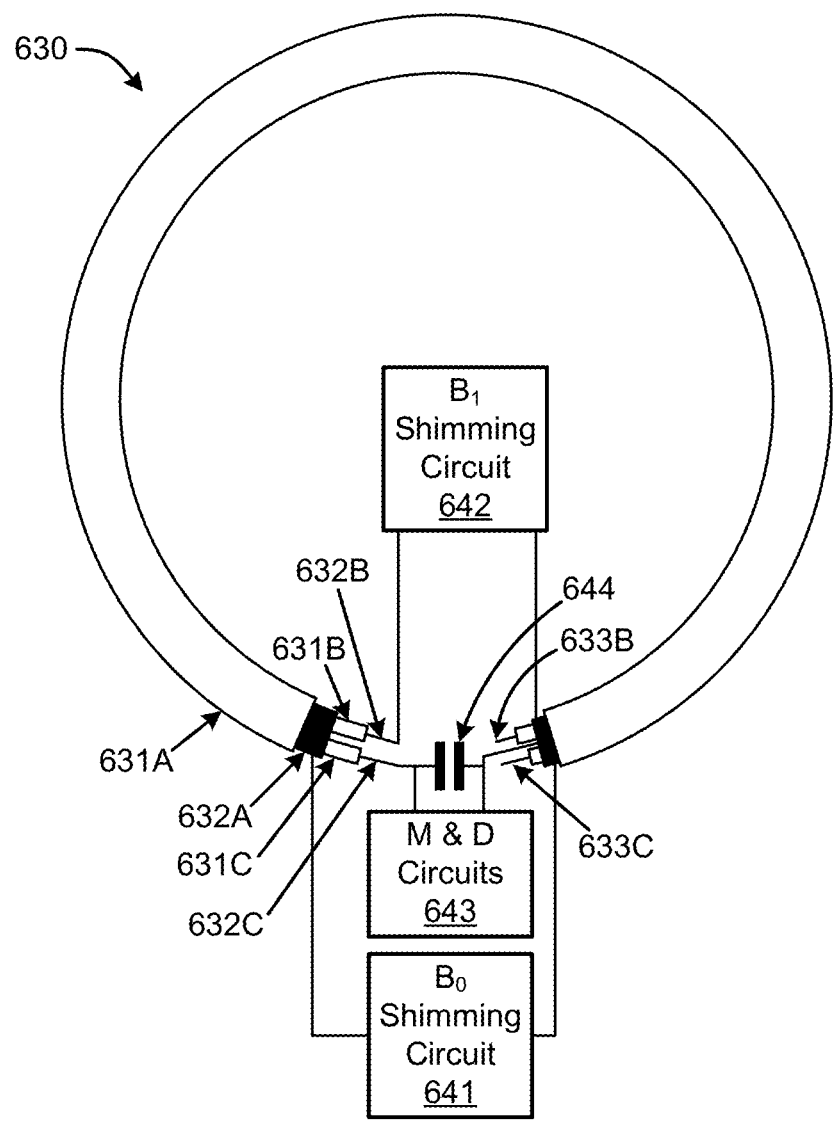
FIG. 6 illustrates an example embodiment of an RF coil.

FIG. 6 illustrates an example embodiment of an RF coil. Like FIG. 5A, the RF coil 630 includes three dielectric-wrapped conductors 631-a first dielectric-wrapped conductor 631A, a second dielectric-wrapped conductor 631B, and a third dielectric-wrapped conductor 631C-that are arranged in a twin axial configuration and that compose an RF coil element. Thus, the first dielectric-wrapped conductor 631A includes an electrical conductor 632A that surrounds the second dielectric-wrapped conductor 631B and the third dielectric-wrapped conductor 631C. Also, the second dielectric-wrapped conductor 631B and the third dielectric-wrapped conductor 631C include respective electrical conductors 632B-C. However, two of the electrical conductors 632B-C have respective unconnected ends 633B-C.

Each of the other ends of the electrical conductors 632A-C are connected to one or more of the following: a $B_0$ shimming circuit 641, a $B_1$ shimming circuit 642, matching and decoupling circuits 643, and a capacitor 644. In this embodiment, the first electrical conductor 632A has (i) a first end that is connected to the $B_0$ shimming circuit 641 and (ii) a second end that is connected to the $B_0$ shimming circuit 641, to the $B_1$ shimming circuit 642, to the capacitor 644, and to the matching and decoupling circuits 643. The second electrical conductor 632B has (i) a first end that is connected to the $B_1$ shimming circuit 642 and (ii) an unconnected end 633B. And the third electrical conductor 632C has (i) a first end that is connected to the capacitor 644 and to the matching and decoupling circuits 643 and (ii) an unconnected end 633C.

Figure 7A:
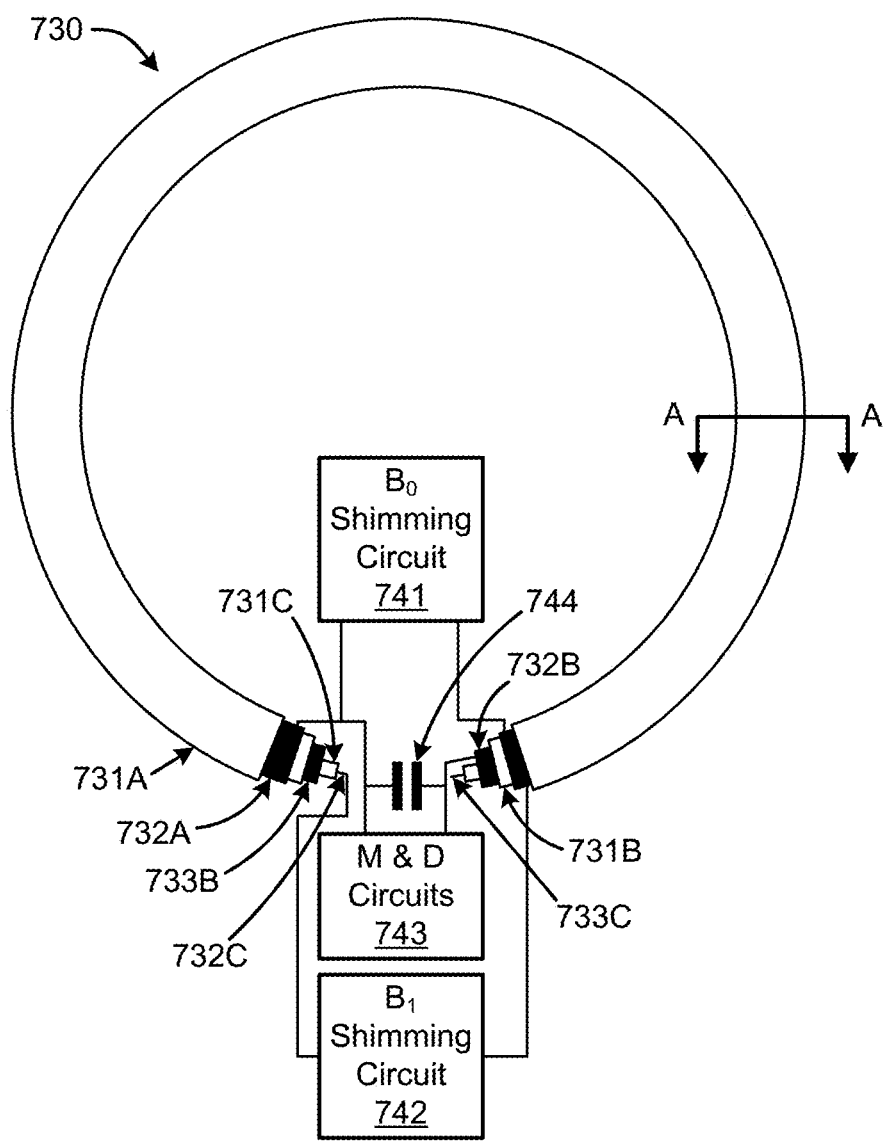
FIG. 7A illustrates an example embodiment of an RF coil.
Figure 7B:
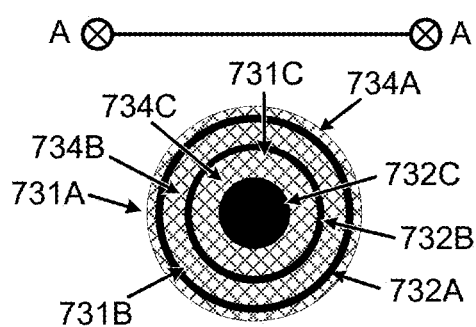
FIG. 7B illustrates a cross-sectional view of the RF coil of FIG. 7A taken from the line A-A.

FIG. 7A illustrates an example embodiment of an RF coil, and FIG. 7B illustrates a cross-sectional view of the RF coil of FIG. 7A taken from the line A-A. The RF coil 730 includes three dielectric-wrapped conductors: a first dielectric-wrapped conductor 731A, a second dielectric-wrapped conductor 731B, and a third dielectric-wrapped conductor 731C (collectively, the "dielectric-wrapped conductors 731"). The dielectric-wrapped conductors 731 are arranged in a triaxial configuration and compose an RF coil element. Thus, the first dielectric-wrapped conductor 731A includes a first electrical conductor 732A that surrounds the second dielectric-wrapped conductor 731B and the third dielectric-wrapped conductor 731C, and the second dielectric-wrapped conductor 731B includes a second electrical conductor 732B that surrounds the third dielectric-wrapped conductor 731C. Accordingly, the RF coil 730 includes three electrical conductors 732A-C that form a closed RF loop, and the three electrical conductors 732A-C are each immediately surrounded by a respective dielectric material 734A-C. At least some of the first dielectric material 734A, the second dielectric material 734B, and the third dielectric material 734C may be the same dielectric material, or they may all be different from each other.

In this embodiment, the second electrical conductor 732B has an unconnected end 733B, and the third electrical conductor 732C has an unconnected end 733C. Each of the other ends of the electrical conductors 732A-C are connected to one or more of the following: a $B_0$ shimming circuit 741, a $B_1$ shimming circuit 742, matching and decoupling circuits 743, and a capacitor 744. In this embodiment, the first electrical conductor 732A has (i) a first end that is connected to the $B_0$ shimming circuit 741, to the capacitor 744, and to the matching and decoupling circuits 743 and (ii) a second end that is connected to the $B_0$ shimming circuit 741 and to the $B_1$ shimming circuit 742. The second electrical conductor 732B has (i) a first end that is connected to the capacitor 744 and to the matching and decoupling circuits 743 and (ii) an unconnected end 733B. And the third electrical conductor 732C has (i) a first end that is connected to the $B_1$ shimming circuit 742 and (ii) an unconnected end 733C.

Figure 8A:
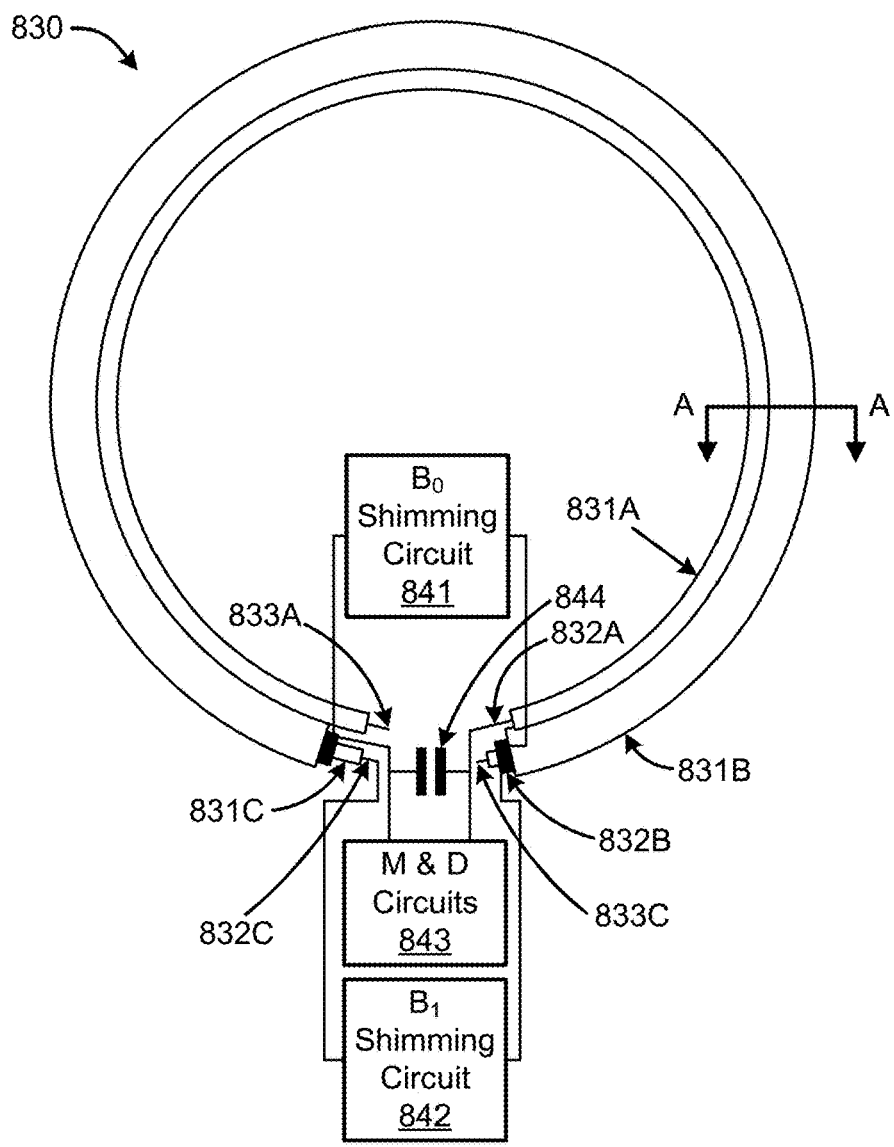
FIG. 8A illustrates an example embodiment of an RF coil.
Figure 8B:
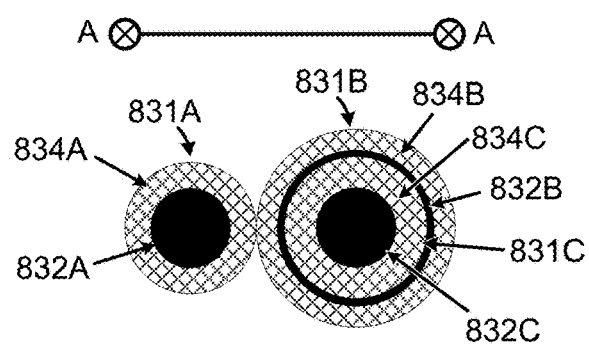
FIG. 8B illustrates a cross-sectional view of the RF coil of FIG. 8A taken from the line A-A.

FIG. 8A illustrates an example embodiment of an RF coil, and FIG. 8B illustrates a cross-sectional view of the RF coil of FIG. 8A taken from the line A-A. The RF coil 830 includes three dielectric-wrapped conductors that compose an RF coil element: a first dielectric-wrapped conductor 831A, a second dielectric-wrapped conductor 831B, and a third dielectric-wrapped conductor 831C (collectively, the "dielectric-wrapped conductors 831"). The second dielectric-wrapped conductor 831B and the third dielectric-wrapped conductor 831C are arranged in a coaxial configuration. The first dielectric-wrapped conductor 831A includes a first electrical conductor 832A, and the second dielectric-wrapped conductor 831B includes a second electrical conductor 832B that surrounds the third dielectric-wrapped conductor 831C. The third dielectric-wrapped conductor 831C also includes a third electrical conductor 832C. Accordingly, the RF coil 830 includes three electrical conductors 832A-C, and the three electrical conductors 832A-C are each immediately surrounded by a respective dielectric material 834A-C. At least some of the first dielectric material 834A, the second dielectric material 834B, and the third dielectric material 834C may be the same dielectric material, or they may all be different from each other.

In this embodiment, the first electrical conductor 832A has an unconnected end 833A, and the third electrical conductor 832C has an unconnected end 833C. Each of the other ends of the electrical conductors 832A-C are connected to one of more of the following: a $B_0$ shimming circuit 841, a $B_1$ shimming circuit 842, matching and decoupling circuits 843, and a capacitor 844. In this embodiment, the first electrical conductor 832A has (i) a first end that is connected to the capacitor 844 and to the matching and decoupling circuits 843 and (ii) an unconnected end 833A. The second electrical conductor 832B has (i) a first end that is connected to the $B_0$ shimming circuit 841, to the capacitor 844, and to the matching and decoupling circuits 843 and (ii) a second end that is connected to the $B_0$ shimming circuit 841 and to the $B_1$ shimming circuit 842. And the third electrical conductor 832C has (i) a first end that is connected to the $B_1$ shimming circuit 842 and (ii) an unconnected end 833C.

Figure 9A:
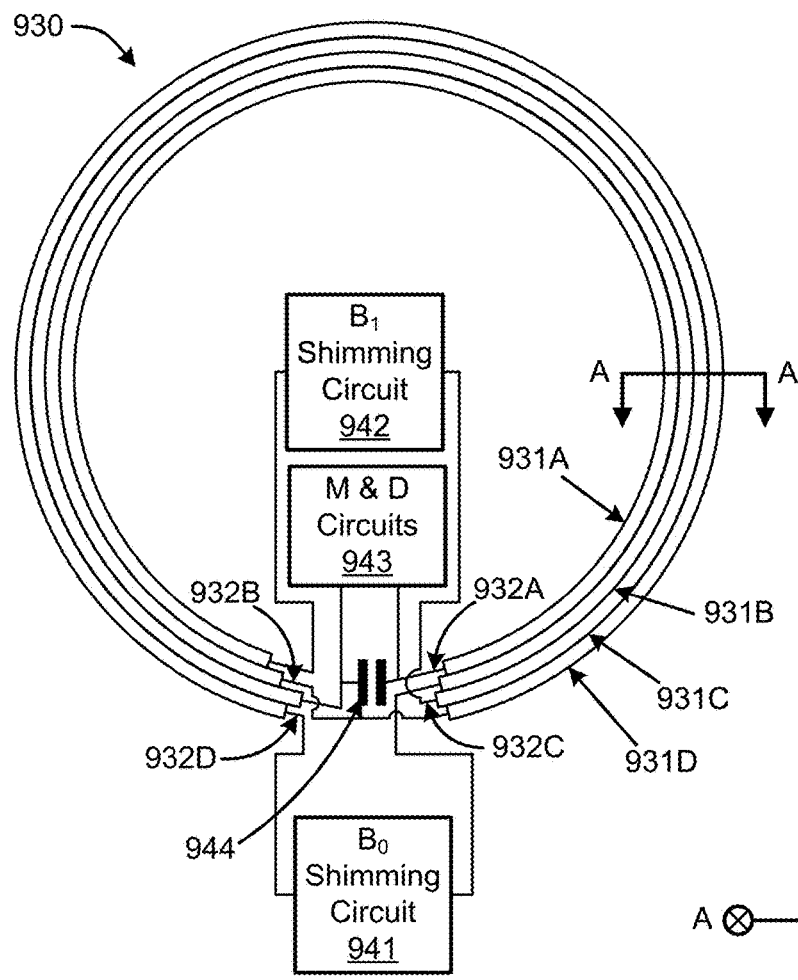
FIG. 9A illustrates an example embodiment of an RF coil.
Figure 9B:
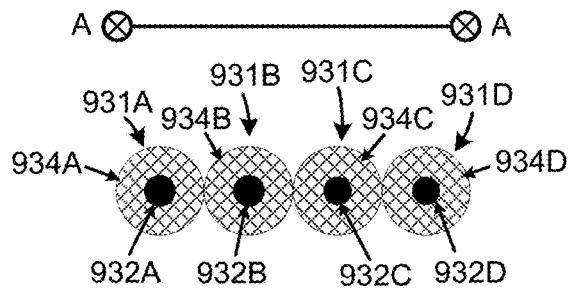
FIG. 9B illustrates a cross-sectional view of the RF coil of FIG. 9A taken from the line A-A.

Some embodiments of RF coils include more than three electrical conductors. For example, FIG. 9A illustrates an example embodiment of an RF coil, and FIG. 9B illustrates a cross-sectional view of the RF coil of FIG. 9A taken from the line A-A. The RF coil 930 includes four dielectric-wrapped conductors that compose an RF coil element: a first dielectric-wrapped conductor 931A, a second dielectric-wrapped conductor 931B, a third dielectric-wrapped conductor 931C, and a fourth dielectric-wrapped conductor 931D (collectively the "dielectric-wrapped conductors 931"). The first dielectric-wrapped conductor 931A includes a first electrical conductor 932A, the second dielectric-wrapped conductor 931B includes a second electrical conductor 932B, the third dielectric-wrapped conductor 931C includes a third electrical conductor 932C, and the fourth dielectric-wrapped conductor 931D includes a fourth electrical conductor 932D. Accordingly, the RF coil 930 includes four electrical conductors 932A-D, and the four electrical conductors 932A-D are each surrounded by a respective dielectric material 934A-D. At least some of the first dielectric material 934A, the second dielectric material 934B, the third dielectric material 934C, and the fourth dielectric material 934D may be the same dielectric material, or they may all be different from each other.

In this embodiment, an end of the second electrical conductor 932B is connected to an end of the fourth electrical conductor 932D. The other ends of the electrical conductors 932A-D are connected to one or more of the following: a $B_0$ shimming circuit 941, a $B_1$ shimming circuit 942, matching and decoupling circuits 943, and a capacitor 944. In this embodiment, the first electrical conductor 932A has (i) a first end that is connected to the $B_1$ shimming circuit 942 and (ii) a second end that is connected to the capacitor 944 and to the matching and decoupling circuits 943. The second electrical conductor 932B has (i) a first end that is connected to a second end of the fourth electrical conductor 932D and (ii) a second end that is connected to the $B_0$ shimming circuit 941. The third electrical conductor 932C has (i) a first end that is connected to the capacitor 944 and to the matching and decoupling circuits 943 and (ii) a second end that is connected to the $B_1$ shimming circuit 942. And the fourth electrical conductor 932D has (i) a first end that is connected to the $B_0$ shimming circuit 941 and (ii) a second end that is connected to a first end of the second electrical conductor 932B.

In the embodiment shown in FIG. 9B, the dielectric-wrapped conductors 931 are locally parallel. Also, the dielectric-wrapped conductors 931 are arranged such that, in the cross-sectional view, they are aligned in a row.

Figure 9C:
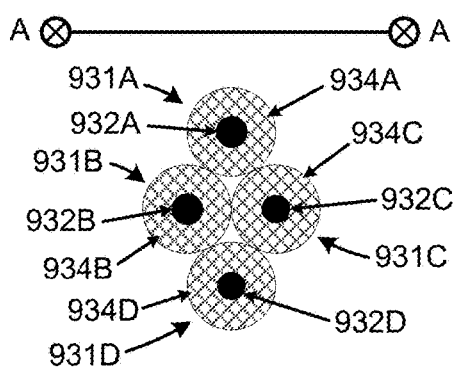
FIG. 9C illustrates the cross-sectional view of another embodiment of the RF coil of FIG. 9A taken from the line A-A.

FIG. 9C illustrates the cross-sectional view of another embodiment of the RF coil of FIG. 9A taken from the line A-A. In this embodiment, the four dielectric-wrapped conductors 931 are arranged so that the first electrical conductor 932A and the fourth electrical conductor 932D are closer to each other than they are in FIG. 9B. Also, in the cross-sectional view, the dielectric-wrapped conductors 931 are arranged such that they form a diamond shape.

Figure 9D:
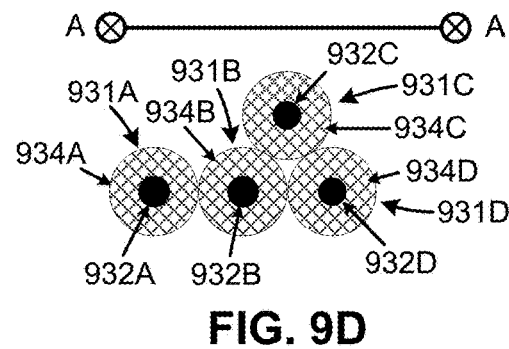
FIG. 9D illustrates the cross-sectional view of another embodiment of the RF coil of FIG. 9A taken from the line A-A.

And the four dielectric-wrapped conductors 931A-D may have other arrangements. For example, FIG. 9D illustrates the cross-sectional view of another embodiment of the RF coil of FIG. 9A taken from the line A-A. In the cross-sectional view, the dielectric-wrapped conductors 931 are arranged such that the second dielectric-wrapped conductor 931B, the third dielectric-wrapped conductor 931C, and the fourth dielectric-wrapped conductor 931D form a triangular shape. Also, the second dielectric-wrapped conductor 931B is closest to the first dielectric-wrapped conductor 931A. Thus, in the cross-sectional view, the dielectric-wrapped conductors 931 are arranged such that they form an approximate ꝑ shape, where the first dielectric-wrapped conductor 931A forms the base of the ꝑ shape and where the second dielectric-wrapped conductor 931B, the third dielectric-wrapped conductor 931C, and the fourth dielectric-wrapped conductor 931D form the triangle of the ꝑ shape.

Figure 10A:
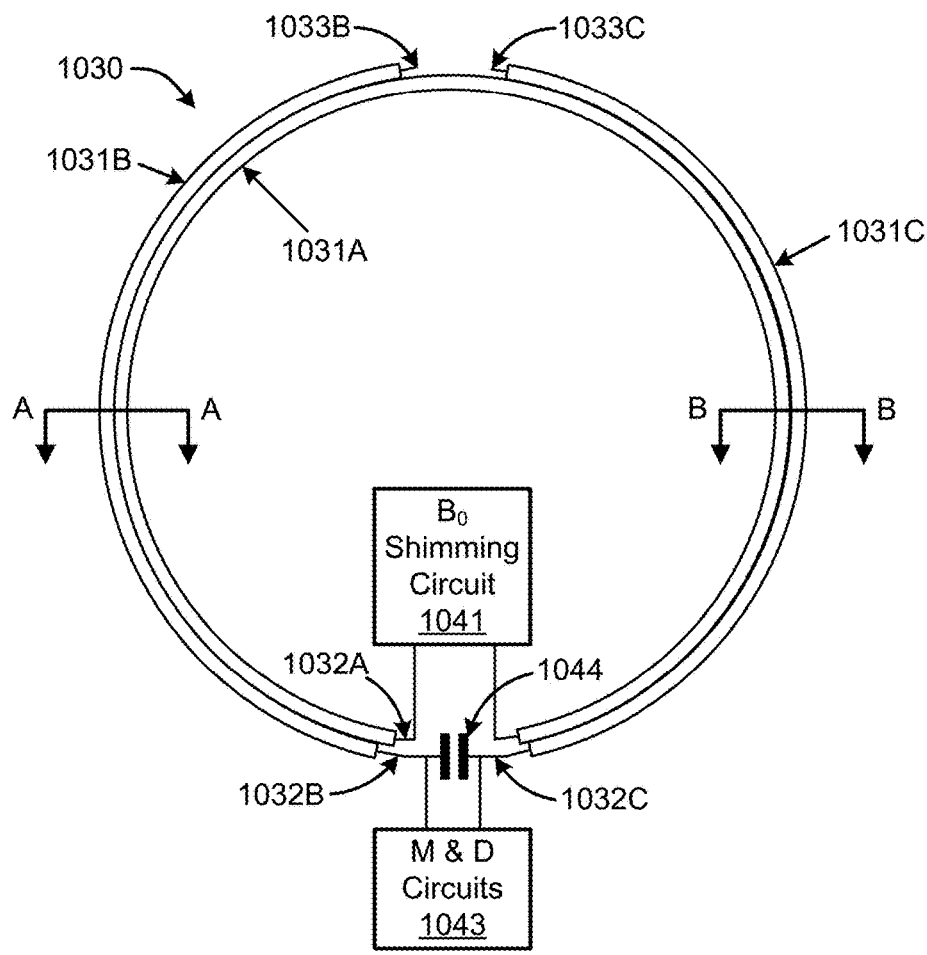
FIG. 10A illustrates an example embodiment of an RF coil.
Figure 10B:
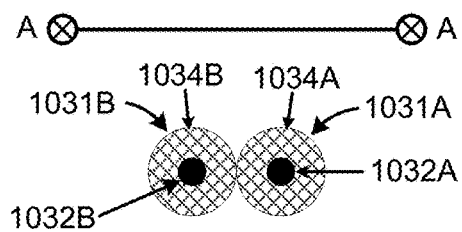
FIG. 10B illustrates a cross-sectional view of the RF coil of FIG. 10A taken from the line A-A.
Figure 10C:
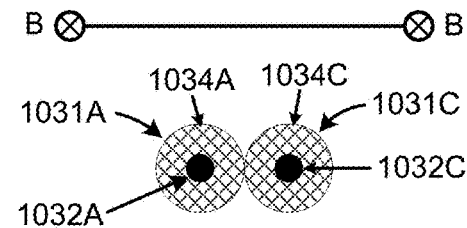
FIG. 10C illustrates a cross-sectional view of the RF coil of FIG. 10A taken from the line B-B.

FIG. 10A illustrates an example embodiment of an RF coil, FIG. 10B illustrates a cross-sectional view of the RF coil of FIG. 10A taken from the line A-A, and FIG. 10C illustrates a cross-sectional view of the RF coil of FIG. 10A taken from the line B-B. The RF coil 1030 includes three dielectric-wrapped conductors that compose an RF coil: a first dielectric-wrapped conductor 1031A, a second dielectric-wrapped conductor 1031B, and a third dielectric-wrapped conductor 1031C. The first dielectric-wrapped conductor 1031A includes a first electrical conductor 1032A, the second dielectric-wrapped conductor 1031B includes a second electrical conductor 1032B, and the third dielectric-wrapped conductor 1031C includes a third electrical conductor 1032C. Accordingly, the RF coil 1030 includes three electrical conductors 1032A-C, and the three electrical conductors 1032A-C are each surrounded by a respective dielectric material 1034A-C. At least some of the first dielectric material 1034A, the second dielectric material 1034B, and the third dielectric material 1034C may be the same dielectric material, or they may all be different from each other.

In this embodiment, the second electrical conductor 1032B and the third electrical conductor 1032C each do not extend around the entire length (e.g., circumference, perimeter) of the RF coil 1030 and do not overlap each other. Instead, in this embodiment, the second electrical conductor 1032B and the third electrical conductor 1032C each extends around approximately half of the length of the RF coil 1030. However, in some embodiments, the second electrical conductor 1032B and the third electrical conductor 1032C are not symmetrical, one of the second electrical conductor 1032B and the third electrical conductor 1032C extends around more than half of the length of the RF coil 1030, or at least one of the second electrical conductor 1032B and the third electrical conductor 1032C extends around substantially less than half of the length of the RF coil 1030. The lengths of the second electrical conductor 1032B and the third electrical conductor 1032C-and thus the lengths of their overlaps with the first electrical conductor 1032A-can be adjusted, and this adjustment can be used to tune the RF coil 1030.

Also, the second electrical conductor 1032B has an unconnected end 1033B and an end that connects to matching and decoupling circuits 1043 and a capacitor 1044, and the third electrical conductor 1032C has an unconnected end 1033C and an end that connects to the matching and decoupling circuits 1043 and the capacitor 1044. The first electrical conductor 1032A has two ends that connect to a $B_0$ shimming circuit 1041. Furthermore, some embodiments include a $B_1$ shimming circuit in addition to or in alternative to the $B_0$ shimming circuit 1041.

Figure 11A:
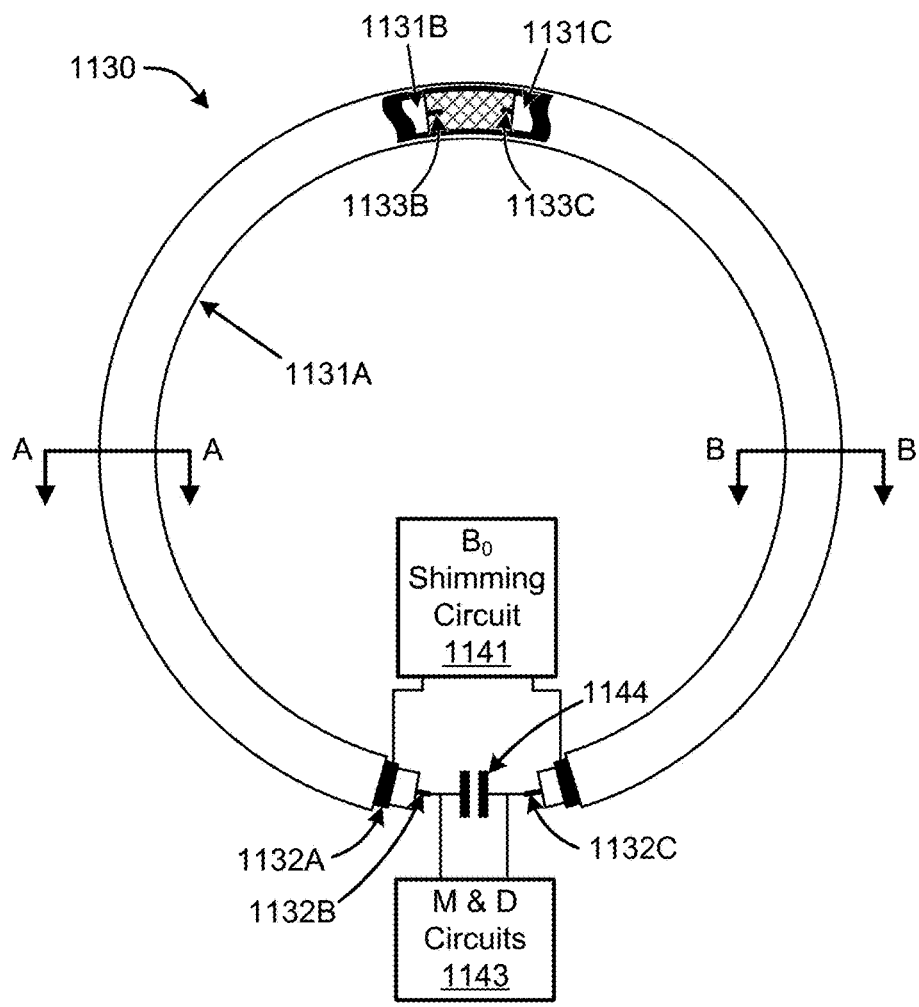
FIG. 11A illustrates an example embodiment of an RF coil.
Figure 11B:
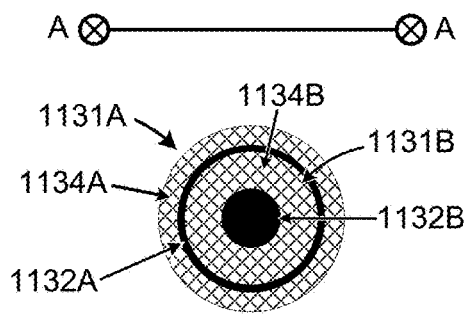
FIG. 11B illustrates a cross-sectional view of the RF coil of FIG. 11A taken from the line A-A.
Figure 11C:
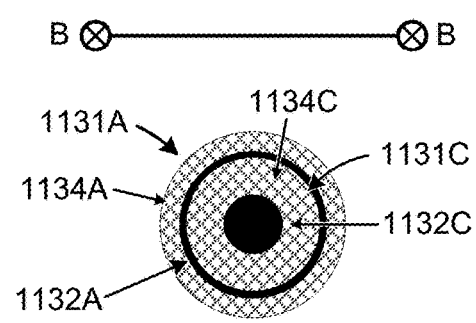
FIG. 11C illustrates a cross-sectional view of the RF coil of FIG. 11A taken from the line B-B.

FIG. 11A illustrates an example embodiment of an RF coil, FIG. 11B illustrates a cross-sectional view of the RF coil of FIG. 11A taken from the line A-A, and FIG. 11C illustrates a cross-sectional view of the RF coil of FIG. 11A taken from the line B-B. The RF coil 1130 includes three dielectric-wrapped conductors: a first dielectric-wrapped conductor 1131A, a second dielectric-wrapped conductor 1131B, and a third dielectric-wrapped conductor 1131C. The first dielectric-wrapped conductor 1131A includes a first electrical conductor 1132A, the second dielectric-wrapped conductor 1131B includes a second electrical conductor 1132B, and the third dielectric-wrapped conductor 1131C includes a third electrical conductor 1132C. Accordingly, the RF coil 1130 includes three electrical conductors 1132A-C, and the three electrical conductors 1132A-C are each surrounded by a respective dielectric material 1134A-C. At least some of the first dielectric material 1134A, the second dielectric material 1134B, and the third dielectric material 1134C may be the same dielectric material, or they may all be different from each other.

In this embodiment, the first dielectric-wrapped conductor 1131A and the second dielectric-wrapped conductor 1131B are arranged coaxially, and the first dielectric-wrapped conductor 1131A and the third dielectric-wrapped conductor 1131C are arranged coaxially. Also, in this example, the second electrical conductor 1132B and the third electrical conductor 1132C each extends around only part of the length of the RF coil 1130, and, inside the first dielectric-wrapped conductor 1131A, the second electrical conductor 1132B and the third electrical conductor 1132C do not overlap each other. The second electrical conductor 1132B has an unconnected end 1133B and an end that connects to matching and decoupling circuits 1143 and a capacitor 1144, and the third electrical conductor 1132C has an unconnected end 1133C and an end that connects to the matching and decoupling circuits 1143 and the capacitor 1144. The first electrical conductor 1132A has ends that connect to a $B_0$ shimming circuit 1141. Also, some embodiments include a $B_1$ shimming circuit in addition to or in alternative to the $B_0$ shimming circuit 1141.

FIG. 12A illustrates an example embodiment of an RF coil, FIG. 12B illustrates a cross-sectional view of the RF coil of FIG. 12A taken from the line A-A, and FIG. 12C illustrates a cross-sectional view of the RF coil of FIG. 12A taken from the line B-B. The RF coil 1230 includes four dielectric-wrapped conductors: a first dielectric-wrapped conductor 1231A, a second dielectric-wrapped conductor 1231B, a third dielectric-wrapped conductor 1231C, and a fourth dielectric-wrapped conductor 1231D. The first dielectric-wrapped conductor 1231A and the second dielectric-wrapped conductor 1231B are arranged coaxially, and the third dielectric-wrapped conductor 1231C and the fourth dielectric-wrapped conductor 1231D are arranged coaxially. The first dielectric-wrapped conductor 1231A includes a first electrical conductor 1232A, the second dielectric-wrapped conductor 1231B includes a second electrical conductor 1232B, the third dielectric-wrapped conductor 1231C includes a third electrical conductor 1232C, and the fourth dielectric-wrapped conductor 1231D includes a fourth electrical conductor 1232D. The electrical conductors 1232A-D are each jacketed in a respective dielectric material 1234A-C. At least some of the first dielectric material 1234A, the second dielectric material 1234B, the third dielectric material 1234C, and the fourth dielectric material 1234D may be the same dielectric material, or they may all be different from each other.

Also, in this embodiment, the first electrical conductor 1232A and the second electrical conductor 1232B extend around approximately half of the length of the RF coil 1230, and the third electrical conductor 1232C and the fourth electrical conductor 1232D extend around approximately another half of the length of the RF coil 1230. Neither the first electrical conductor 1232A nor the second electrical conductor 1232B overlaps either of the third electrical conductor 1232C and the fourth electrical conductor 1232D along the length of the RF coil 1230. Furthermore, neither the third electrical conductor 1232C nor the fourth electrical conductor 1232D overlaps either of the first electrical conductor 1232A and the second electrical conductor 1232B along the length of the RF coil 1230.

Each electrical conductor 1232A-D has a respective unconnected end 1233A-D. Also, the first electrical conductor 1232A has an end that connects to a first capacitor 1244A, and the second electrical conductor 1232B has an end that connects to matching and decoupling circuits 1243 and to a second capacitor 1244B. The third electrical conductor 1232C has an end that connects to the first capacitor 1244A, and the fourth electrical conductor 1232D has an end that connects to the matching and decoupling circuits 1243 and to the second capacitor 1244B. Additionally, depending on the embodiment, the capacitance of the first capacitor 1244A may be the same as the capacitance of the second capacitor 1244B, or the capacitance of the first capacitor 1244A may be different from the capacitance of the second capacitor 1244B.

Figure 13A:
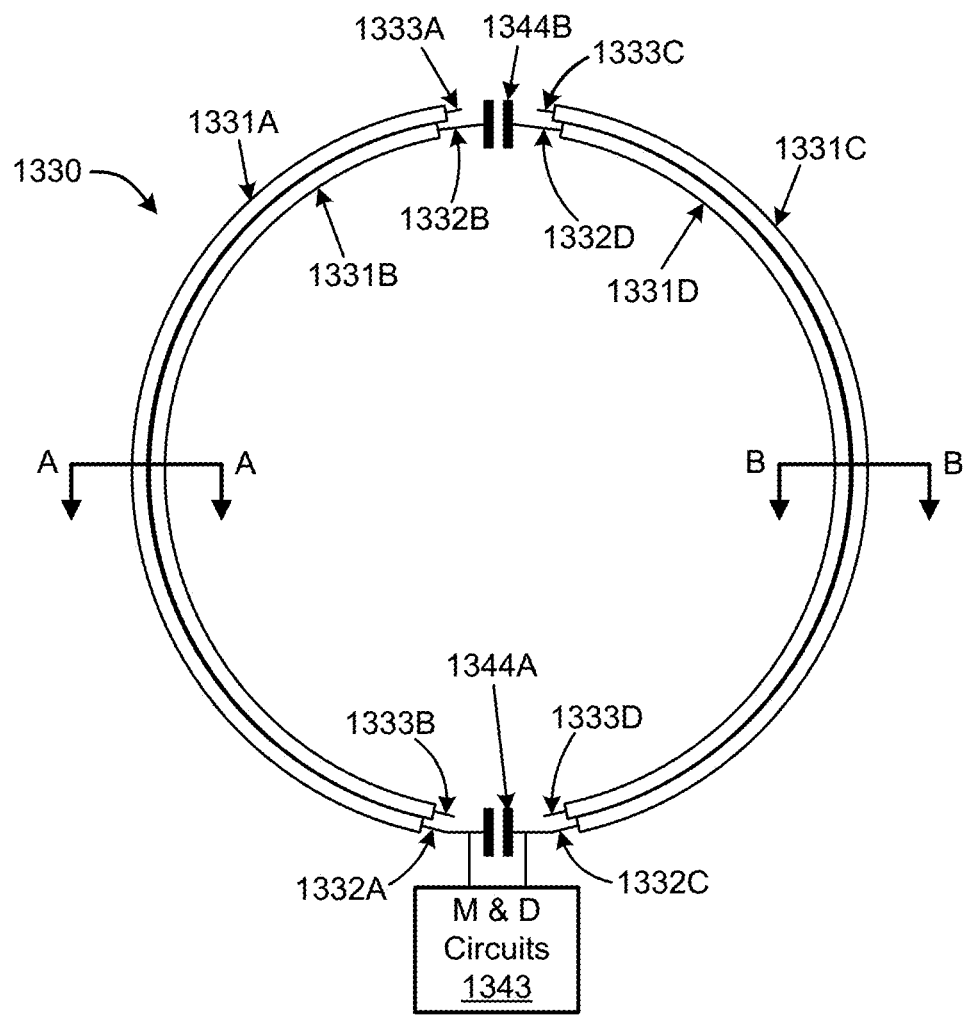
FIG. 13A illustrates an example embodiment of an RF coil.
Figure 13B:
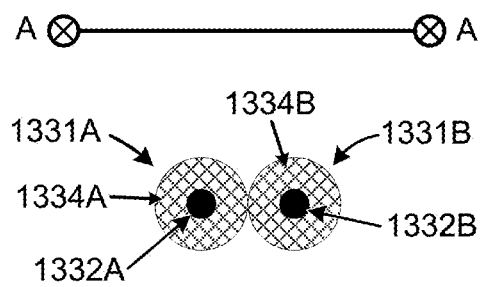
FIG. 13B illustrates a cross-sectional view of the RF coil of FIG. 13A taken from the line A-A.
Figure 13C:
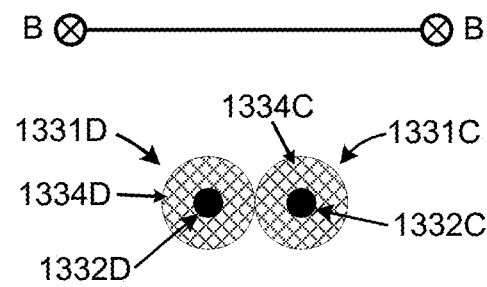
FIG. 13C illustrates a cross-sectional view of the RF coil of FIG. 13A taken from the line B-B.
Figure 14A:
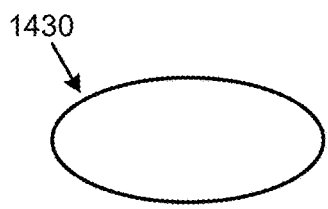
FIGS. 14A-I illustrate example embodiments of RF-coil shapes.
Figure 14B:
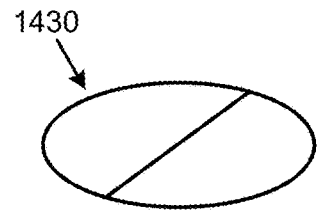
Figure 14C:
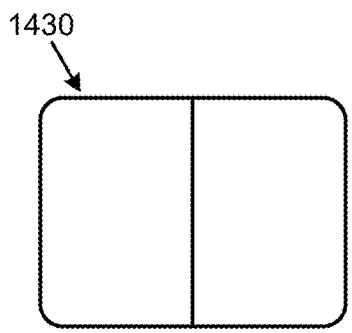
Figure 14D:
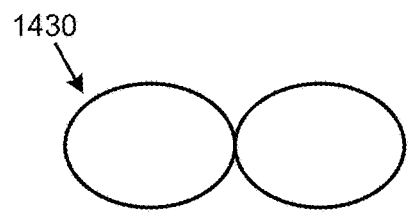
Figure 14E:
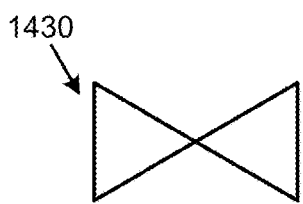
Figure 14F:
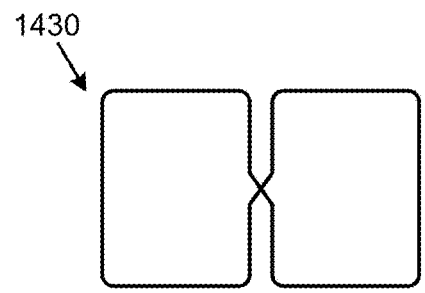
Figure 14G:
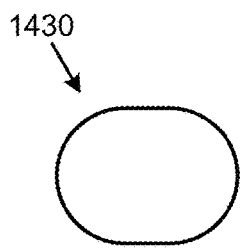
Figure 14H:
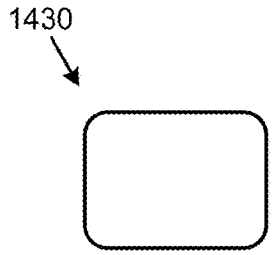
Figure 14I:
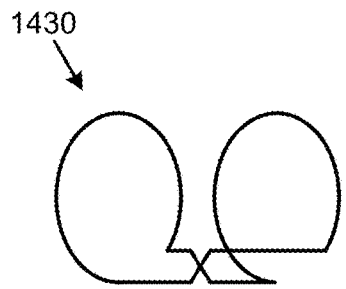
Figure 15A:
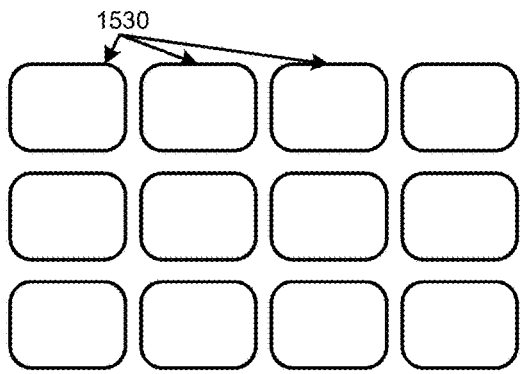
FIGS. 15A-H illustrate example embodiments of RF-coil arrays.
Figure 15B:
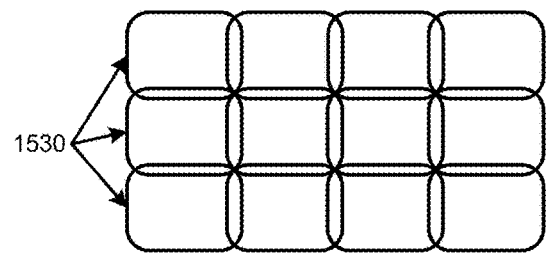
Figure 15C:
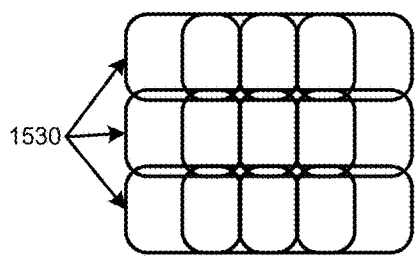
Figure 15D:
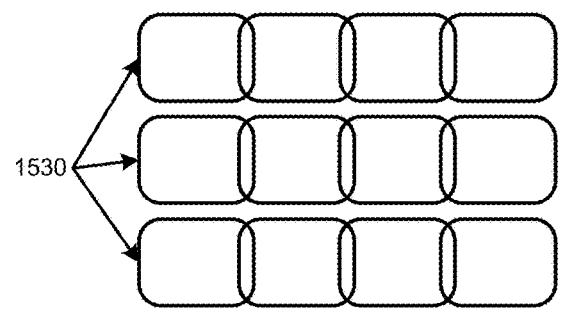
Figure 15E:
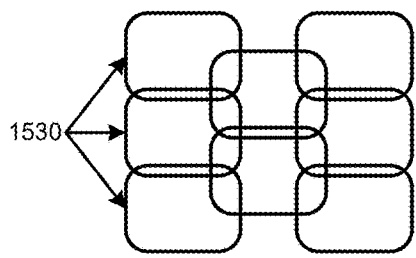
Figure 15F:
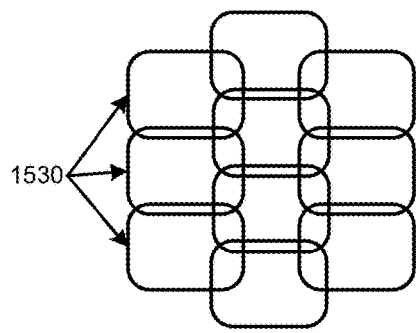
Figure 15G:
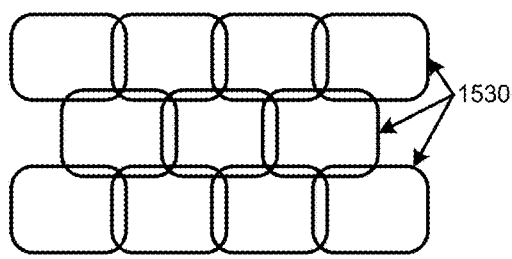
Figure 15H:
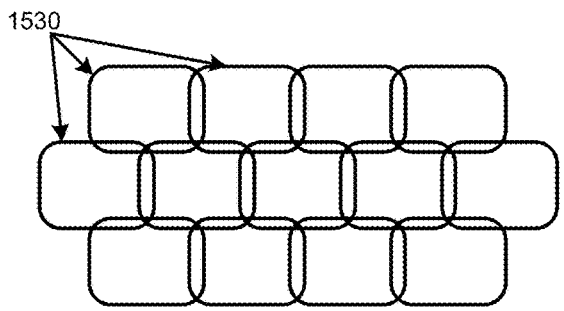

FIG. 13A illustrates an example embodiment of an RF coil, FIG. 13B illustrates a cross-sectional view of the RF coil of FIG. 13A taken from the line A-A, and FIG. 13C illustrates a cross-sectional view of the RF coil of FIG. 13A taken from the line B-B. The RF coil 1330 includes four dielectric-wrapped conductors: a first dielectric-wrapped conductor 1331A, a second dielectric-wrapped conductor 1331B, a third dielectric-wrapped conductor 1331C, and a fourth dielectric-wrapped conductor 1331D. The first dielectric-wrapped conductor 1331A includes a first electrical conductor 1332A, the second dielectric-wrapped conductor 1331B includes a second electrical conductor 1332B, the third dielectric-wrapped conductor 1331C includes a third electrical conductor 1332C, and the fourth dielectric-wrapped conductor 1331D includes a fourth electrical conductor 1332D. The electrical conductors 1332A-D are jacketed in respective dielectric materials 1334A-D. At least some of the first dielectric material 1334A, the second dielectric material 1334B, the third dielectric material 1334C, and the fourth dielectric material 1334D may be the same dielectric material, or they may all be different from each other.

In this embodiment, the first electrical conductor 1332A and the second electrical conductor 1332B extend around approximately half of the length of the RF coil 1330, and the third electrical conductor 1332C and the fourth electrical conductor 1332D extend around approximately another half of the length of the RF coil 1330. Neither the first electrical conductor 1332A nor the second electrical conductor 1332B overlaps either of the third electrical conductor 1332C and the fourth electrical conductor 1332D along the length of the RF coil 1330. Furthermore, neither the third electrical conductor 1332C nor the fourth electrical conductor 1332D overlaps either of the first electrical conductor 1332A and the second electrical conductor 1332B along the length of the RF coil 1330. However, in some embodiments, the first electrical conductor 1332A and the third electrical conductor 1332C are not symmetrical, the second electrical conductor 1332B and the fourth electrical conductor 1332D are not symmetrical, or at least one of the electrical conductors 1332A-D extends around substantially less than half of the length of the RF coil 1330.

Each electrical conductor 1332A-D has a respective unconnected end 1333A-D. Also, the first electrical conductor 1332A has an end that connects to a first capacitor 1344A and to matching and decoupling circuits 1343, and the second electrical conductor 1332B has an end that connects to a second capacitor 1344B. The third electrical conductor 1332C has an end that connects to the first capacitor 1344A and to the matching and decoupling circuits 1343, and the fourth electrical conductor 1332D has an end that connects to the second capacitor 1344B. Additionally, depending on the embodiment, the capacitance of the first capacitor 1344A may be the same as the capacitance of the second capacitor 1344B, or the capacitance of the first capacitor 1344A may be different from the capacitance of the second capacitor 1344B.

Some embodiments of the RF coils have shapes that are different from the shapes in FIGS. 2A, 3A, 4A, 5A, 6, 7A, 8A, 9A, 10A, 11A, 12A, and 13A. For example, FIGS. 14A-I illustrate example embodiments of the shapes of RF coils 1430. The shape of an RF coil, as well as its other parameters, can be selected and configured for a particular application (e.g., an RF transmit coil, and RF receive coil, and RF transmit-receive coil).

Also, multiple RF coils may be arranged in an RF-coil array. FIGS. 15A-H illustrate example embodiments of RF-coil arrays. As shown by the example embodiment in FIG. 15A, some RF-coil arrays include RF coils 1530 that do not overlap. And, as shown by FIGS. 15B-H, some RF-coil arrays include RF coils 1530 that overlap in varying amounts and arrangements. The shimming circuits, the matching and decoupling circuits, and the control methods that are used to operate the RF-coil arrays can be configured for different applications. For example, the shimming circuits, the matching and decoupling circuits, and the control methods may be configured based on one or more of the following: the parameters of an MRI device, the scanning pattern, the anatomy of the patient or object to be scanned, the material (e.g., tissue) to be scanned, and the positions and orientations of the RF coils 1530 in the RF-coil arrays (including the positions and orientations when the RF-coil arrays are placed around the object (e.g., patient) being scanned).

Figure 16A:
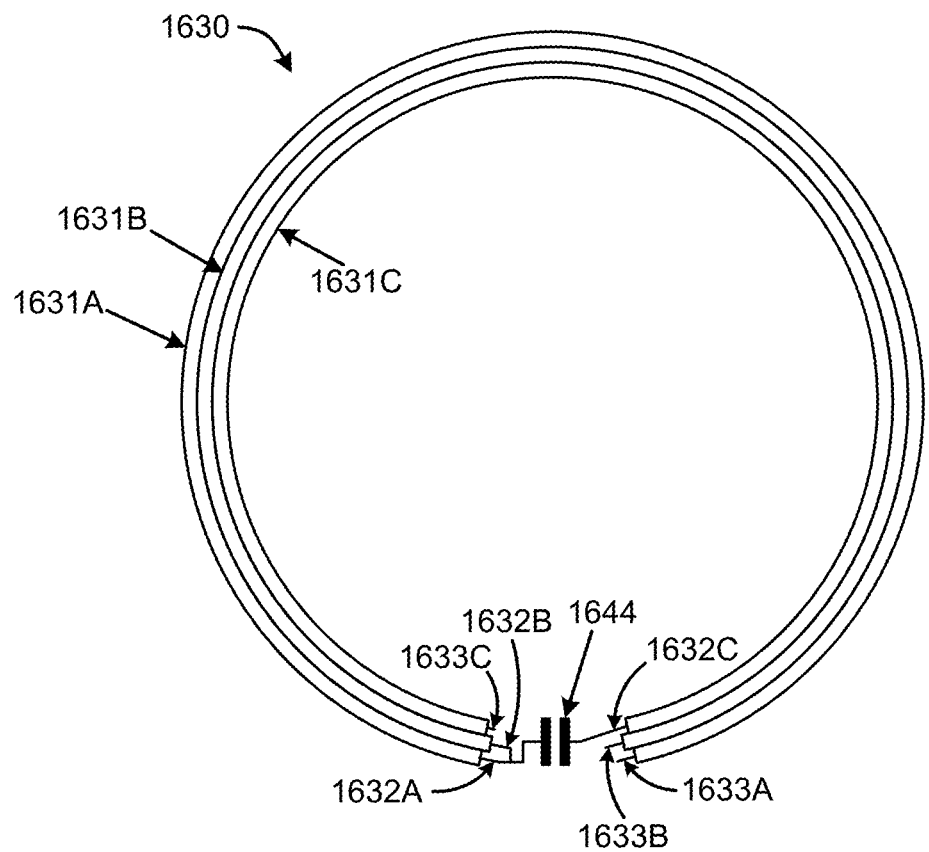
FIG. 16A illustrates an example embodiment of an RF coil.
Figure 16B:
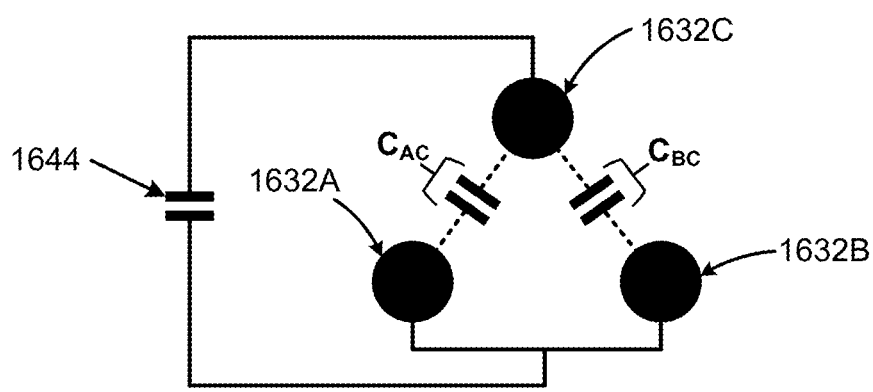
FIG. 16B illustrates the capacitances between the electrical conductors in FIG. 16A.

FIG. 16A illustrates an example embodiment of an RF coil, and FIG. 16B illustrates the capacitances between the electrical conductors in FIG. 16A. The RF coil 1630 includes three dielectric-wrapped conductors: a first dielectric-wrapped conductor 1631A, a second dielectric-wrapped conductor 1631B, and a third dielectric-wrapped conductor 1631C. The first dielectric-wrapped conductor 1631A includes a first electrical conductor 1632A, the second dielectric-wrapped conductor 1631B includes a second electrical conductor 1632B, and the third dielectric-wrapped conductor 1631C includes a third electrical conductor 1632C. One end of a capacitor 1644 is connected to both the first electrical conductor 1632A and the second electrical conductor 1632B, and the other end of the capacitor 1644 is connected to the third electrical conductor 1632C.

In FIG. 16A, the first electrical conductor 1632A, the second electrical conductor 1632B, and the third electrical conductor 1632C each include a respective unconnected end 1633A-C. However, in some embodiments, at least one of the unconnected ends 1633A-C is connected to one or more other circuits (e.g., matching and decoupling circuits, a $B_0$ shimming circuit, a $B_1$ shimming circuit). Likewise, at least one of the ends of the first electrical conductor 1632A, the second electrical conductor 1632B, and the third electrical conductor 1632C that are connected to the capacitor 1644 may also be connected to one or more other circuits.

The distributed capacitance between the first electrical conductor 1632A and the third electrical conductor 1632C is $C_{AC}$. Also, the distributed capacitance between the second electrical conductor 1632B and the third electrical conductor 1632C is $C_{BC}$. Thus, the total distributed capacitance $C_T$ is $C_T = C_{AC} + C_{BC}$. Because two electrical conductors are connected to one end of the capacitor 1644, and because one electrical conductor is connected to another end of the capacitor 1644, this embodiment of an RF coil 1630 may have a greater tuning range or a higher Q value than some other embodiments. This can also be applied to RF coils that include more than three electrical conductors, such as the embodiment of an RF coil in FIG. 17A.

Figure 17A:
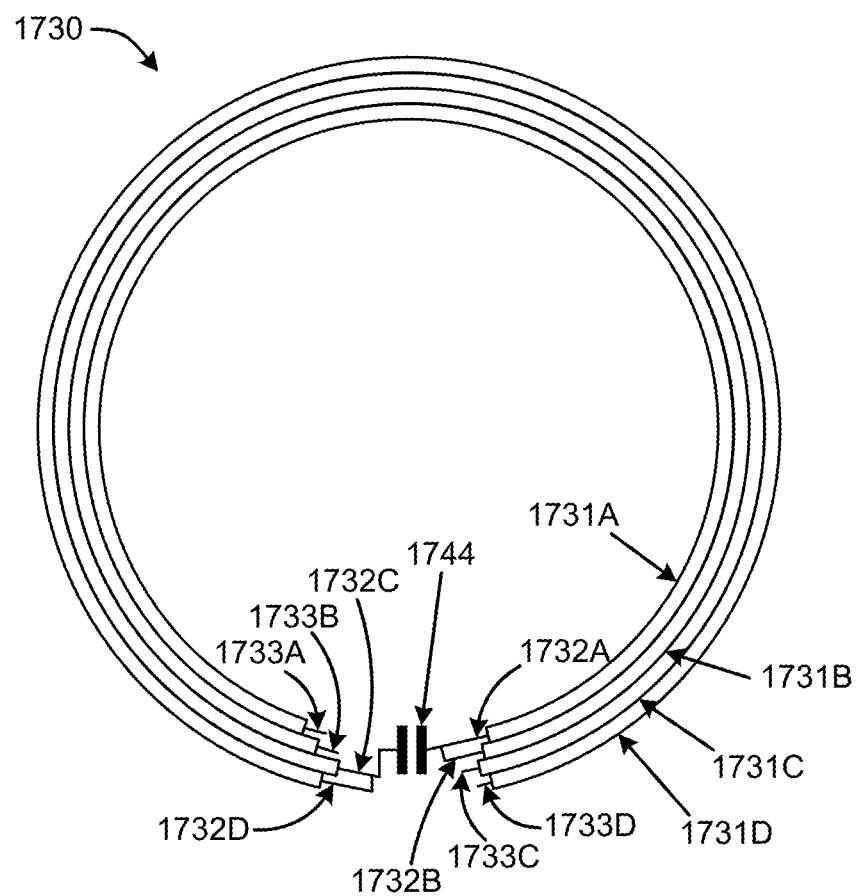
FIG. 17A illustrates an example embodiment of an RF coil.
Figure 17B:
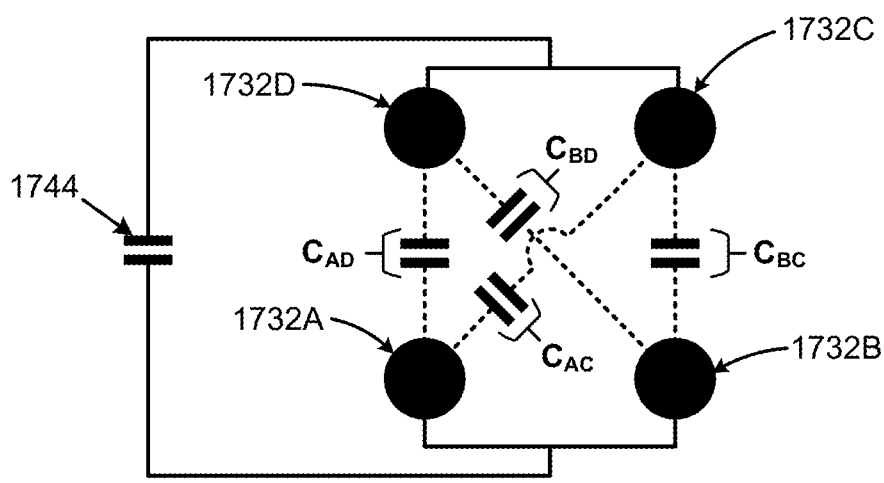
FIG. 17B illustrates the capacitances between the electrical conductors in FIG. 17A.

FIG. 17A illustrates an example embodiment of an RF coil, and FIG. 17B illustrates the capacitances between the electrical conductors in FIG. 17A. The RF coil 1730 includes four dielectric-wrapped conductors: a first dielectric-wrapped conductor 1731A, a second dielectric-wrapped conductor 1731B, a third dielectric-wrapped conductor 1731C, and a fourth dielectric-wrapped conductor 1731D. The first dielectric-wrapped conductor 1731A includes a first electrical conductor 1732A, the second dielectric-wrapped conductor 1731B includes a second electrical conductor 1732B, the third dielectric-wrapped conductor 1731C includes a third electrical conductor 1732C, and the fourth dielectric-wrapped conductor 1731D includes a fourth electrical conductor 1732D. Also, each of the electrical conductors 1732A-D has a respective unconnected end 1733A-D.

One end of a capacitor 1744 is connected to both the first electrical conductor 1732A and the second electrical conductor 1732B, and the other end of the capacitor 1744 is connected to both the third electrical conductor 1732C and the fourth electrical conductor 1732D.

Although in FIG. 17A each of the electrical conductors 1732A-D has a respective unconnected end 1733A-D, in some embodiments, at least one of the unconnected ends 1733A-D is connected to one or more other circuits (e.g., matching and decoupling circuits, a $B_0$ shimming circuit, a $B_1$ shimming circuit). Likewise, at least one of the ends of the first electrical conductor 1732A, the second electrical conductor 1732B, the third electrical conductor 1732C, and the fourth electrical conductor 1732D that are connected to the capacitor 1744 may also be connected to one or more other circuits.

The distributed capacitance between the first electrical conductor 1732A and the third electrical conductor 1732C is $C_{AC}$. And the distributed capacitance between the first electrical conductor 1732A and the fourth electrical conductor 1732D is $C_{AD}$. Also, the distributed capacitance between the second electrical conductor 1732B and the third electrical conductor 1732C is $C_{BC}$. And the distributed capacitance between the second electrical conductor 1732B and the fourth electrical conductor 1732D is $C_{BD}$. Thus, the total distributed capacitance $C_T$ is $C_T = C_{AC} + C_{AD} + C_{BC} + C_{BD}$.

Additionally, Table 1 shows some parameters from example embodiments of RF coils.

TABLE 1

| Example | 1 | 2 | 3 | 4 | 5 |
|---|---|---|---|---|---|
| RF coil diameter (cm) | 11.0 | 11.0 | 11.0 | 11.0 | 11.0 |
| No. of Conductors | 2 | 2 | 3 (2 of 3 to 1 of 3)* | 3 (1 of 3 to 1 of 3)** | 2 |
| Conductor Cross-sec. Diameter (mm)*** | 0.36 | 0.51 | 2 × 0.51 1 × 0.40 | 2 × 0.51 1 × 0.40 | Outer: 1.85 Inner: 0.50 |
| Conductor type | Twisted | Twisted | Twisted | Twisted | Coaxial |

*One side of a capacitor is connected to two of the three conductors, and another side of the capacitor is connected to only one of the three conductors (e.g., as shown in FIG. 2D).
**One side of a capacitor is connected to only one of the three conductors and another side of the capacitor is connected to only one of the three conductors (e.g. as shown in FIG. 2A).
***Some of the conductors are composed of multiple smaller conductors, and the cross-sectional diameter is the diameter of the combined multiple smaller conductors.

As noted above, the lengths and overlaps of the electrical conductors can be adjusted to tune the RF coil, for example as shown in FIGS. 18A, 18B, 19A, and 19B.

Figure 18A:
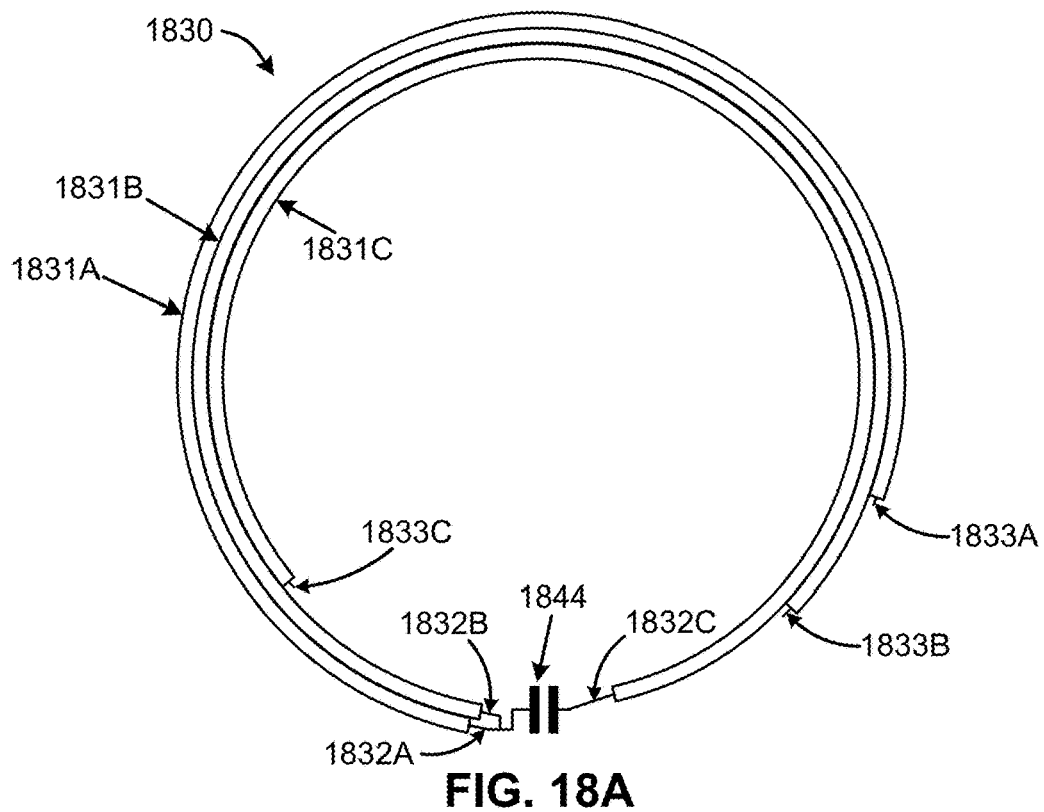
FIG. 18A illustrates an example embodiment of an RF coil.

FIG. 18A illustrates an example embodiment of an RF coil. The RF coil 1830 includes three dielectric-wrapped conductors: a first dielectric-wrapped conductor 1831A, a second dielectric-wrapped conductor 1831B, and a third dielectric-wrapped conductor 1831C. The first dielectric-wrapped conductor 1831A includes a first electrical conductor 1832A, the second dielectric-wrapped conductor 1831B includes a second electrical conductor 1832B, and the third dielectric-wrapped conductor 1831C includes a third electrical conductor 1832C. One end of a capacitor 1844 is connected to both the first electrical conductor 1832A and the second electrical conductor 1832B, and the other end of the capacitor 1844 is connected to the third electrical conductor 1832C. Also, each of the electrical conductors 1832A-C has a respective unconnected end 1833A-C.

In this embodiment, the electrical conductors 1832A-C extend around less of the length (e.g., circumference, perimeter) of the RF coil 1830 than the electrical conductors 1632A-C in FIG. 16A. Moreover, along the length of the RF coil 1830, the electrical conductors 1832A-C overlap each other less than the electrical conductors 1632A-C in FIG. 16A overlap each other.

Although in FIG. 18A each of the electrical conductors 1832A-C has a respective unconnected end 1833A-C, in some embodiments, at least one of the unconnected ends 1833A-C is connected to one or more other circuits (e.g., matching and decoupling circuits, a $B_0$ shimming circuit, a $B_1$ shimming circuit). Likewise, at least one of the ends of the first electrical conductor 1832A, the second electrical conductor 1832B, and the third electrical conductor 1832C that are connected to the capacitor 1844 may also be connected to one or more other circuits.

Figure 18B:
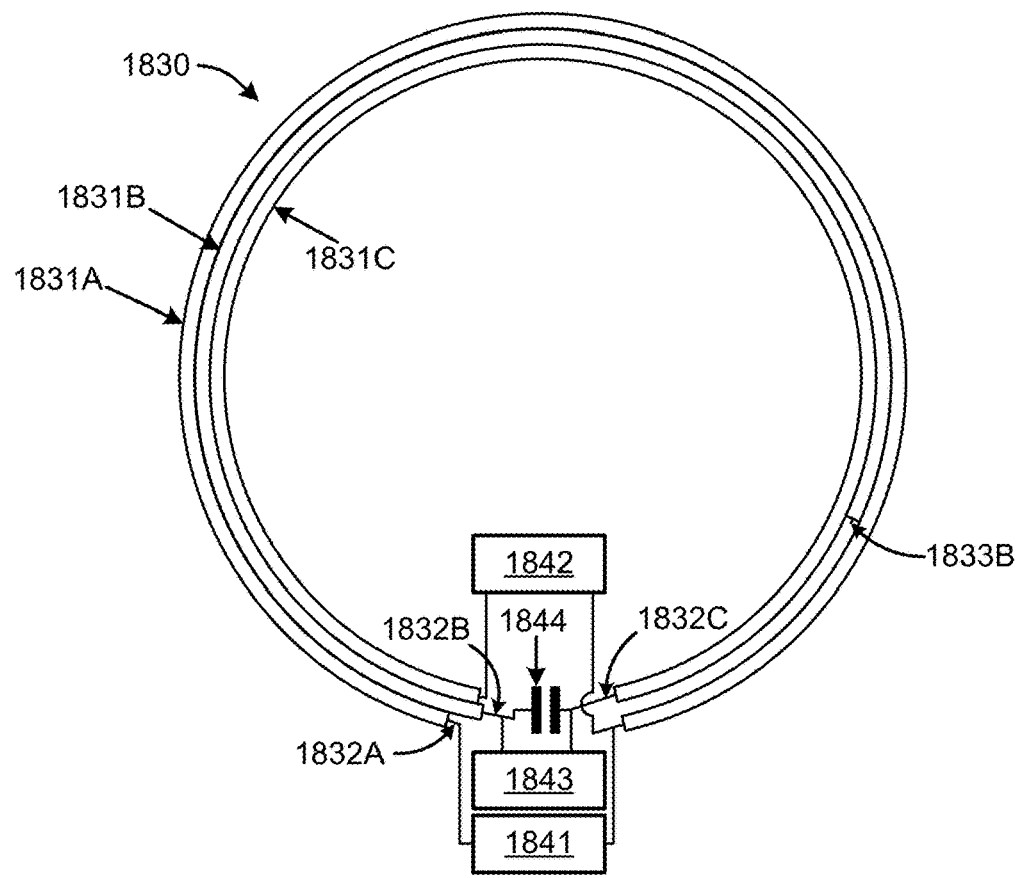
FIG. 18B illustrates an example embodiment of an RF coil.

FIG. 18B illustrates an example embodiment of an RF coil. The RF coil 1830 includes three dielectric-wrapped conductors: a first dielectric-wrapped conductor 1831A, a second dielectric-wrapped conductor 1831B, and a third dielectric-wrapped conductor 1831C. The first dielectric-wrapped conductor 1831A includes a first electrical conductor 1832A, the second dielectric-wrapped conductor 1831B includes a second electrical conductor 1832B, and the third dielectric-wrapped conductor 1831C includes a third electrical conductor 1832C.

The second electrical conductor 1832B has an unconnected end 1833B. The other ends of the electrical conductors 1832A-C are connected to one or more of the following: a $B_0$ shimming circuit 1841, a $B_1$ shimming circuit 1842, matching and decoupling circuits 1843, and a capacitor 1844. In this embodiment, the first electrical conductor 1832A has (i) a first end that is connected to the $B_0$ shimming circuit 1841 and (ii) a second end that is connected to the $B_0$ shimming circuit 1841 and to the $B_1$ shimming circuit 1842. The second electrical conductor 1832B has (i) a first end that is connected to the capacitor 1844 and to the matching and decoupling circuits 1843 and (ii) the unconnected end 1833B. The third electrical conductor 1832C has (i) a first end that is connected to the $B_1$ shimming circuit 1842 and (ii) a second end that is connected to the capacitor 1844 and to the matching and decoupling circuits 1843.

In this embodiment, the second electrical conductor 1832B, which has the unconnected end 1833B, extends around less of the length of the RF coil 1830 than the electrical conductor 432 in FIG. 4A that has the unconnected end 433.

Figure 19A:
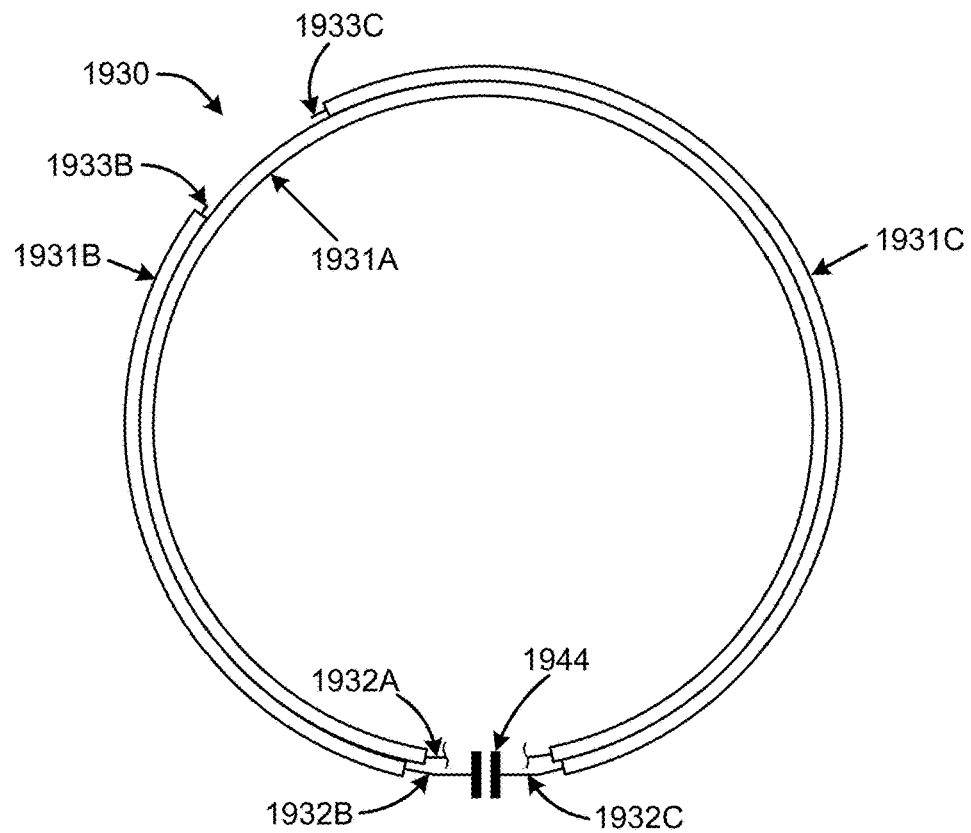
FIG. 19A illustrates an example embodiment of an RF coil.

FIG. 19A illustrates an example embodiment of an RF coil. The RF coil 1930 includes three dielectric-wrapped conductors: a first dielectric-wrapped conductor 1931A, a second dielectric-wrapped conductor 1931B, and a third dielectric-wrapped conductor 1931C. The first dielectric-wrapped conductor 1931A includes a first electrical conductor 1932A, the second dielectric-wrapped conductor 1931B includes a second electrical conductor 1932B, and the third dielectric-wrapped conductor 1931C includes a third electrical conductor 1932C.

The second electrical conductor 1932B and the third electrical conductor 1932C each include a respective unconnected end 1933B-C. Also, a respective end of each of the second electrical conductor 1932B and the third electrical conductor 1932C is connected to a capacitor 1944. And the ends of the first electrical conductor 1932A are connected to one or more other circuits (e.g., matching and decoupling circuits, a $B_0$ shimming circuit, a $B_1$ shimming circuit) (not shown in FIG. 19A). Likewise, the ends of the second electrical conductor 1932B and the third electrical conductor 1932C that are connected to the capacitor 1944 may also be connected to one or more other circuits.

In contrast to the RF coil 1030 in FIG. 10A, in this embodiment the second electrical conductor 1932B and the third electrical conductor 1932C are not symmetrical or approximately symmetrical. Instead, the second electrical conductor 1932B is substantially shorter than the third electrical conductor 1932C, and the third electrical conductor 1932C extends around more than half of the length of the RF coil 1930. Also, along the length of the RF coil 1930, the third electrical conductor 1932C has a greater overlap with the first electrical conductor 1932A than the overlap between the second electrical conductor 1932B and the first electrical conductor 1932A.

Figure 19B:
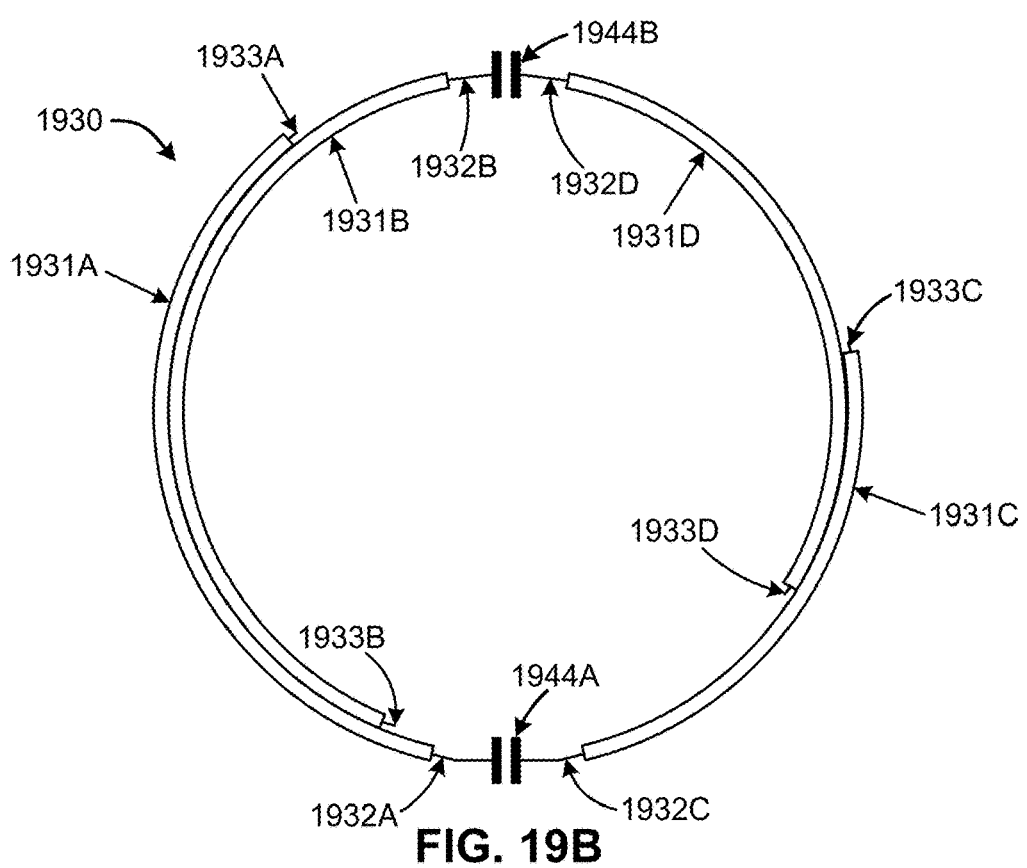
FIG. 19B illustrates an example embodiment of an RF coil.

FIG. 19B illustrates an example embodiment of an RF coil. The RF coil 1930 includes four dielectric-wrapped conductors: a first dielectric-wrapped conductor 1931A, a second dielectric-wrapped conductor 1931B, a third dielectric-wrapped conductor 1931C, and a fourth dielectric-wrapped conductor 1931D. The first dielectric-wrapped conductor 1931A includes a first electrical conductor 1932A, the second dielectric-wrapped conductor 1931B includes a second electrical conductor 1932B, the third dielectric-wrapped conductor 1931C includes a third electrical conductor 1932C, and the fourth dielectric-wrapped conductor 1931D includes a fourth electrical conductor 1932D.

Each of the electrical conductors 1932A-D has a respective unconnected end 1933A-D. A respective end of each of the first electrical conductor 1932A and the third electrical conductor 1932C is connected to a first capacitor 1944A. And a respective end of each of the second electrical conductor 1932B and the fourth electrical conductor 1932D is connected to a second capacitor 1944B. Furthermore, at least one of the ends of the first electrical conductor 1932A and the third electrical conductor 1932C that are connected to the first capacitor 1944A may also be connected to one or more other circuits (e.g., matching and decoupling circuits, a $B_0$ shimming circuit, a $B_1$ shimming circuit) (not shown in FIG. 19A). Additionally, at least one of the ends of the second electrical conductor 1932B and the fourth electrical conductor 1932D that are connected to the second capacitor 1944B may also be connected to one or more other circuits.

In contrast to the RF coil 1330 in FIG. 13A, in FIG. 19B the first electrical conductor 1931A and the third electrical conductor 1931C are not symmetrical or approximately symmetrical, and the second electrical conductor 1931B and the fourth electrical conductor 1931D are not symmetrical or approximately symmetrical. Also, along the length of the RF coil 1930, the overlap between the first electrical conductor 1932A and the second electrical conductor 1932B is greater than the overlap between the third electrical conductor 1932C and the fourth electrical conductor 1932D.

Figure 20:
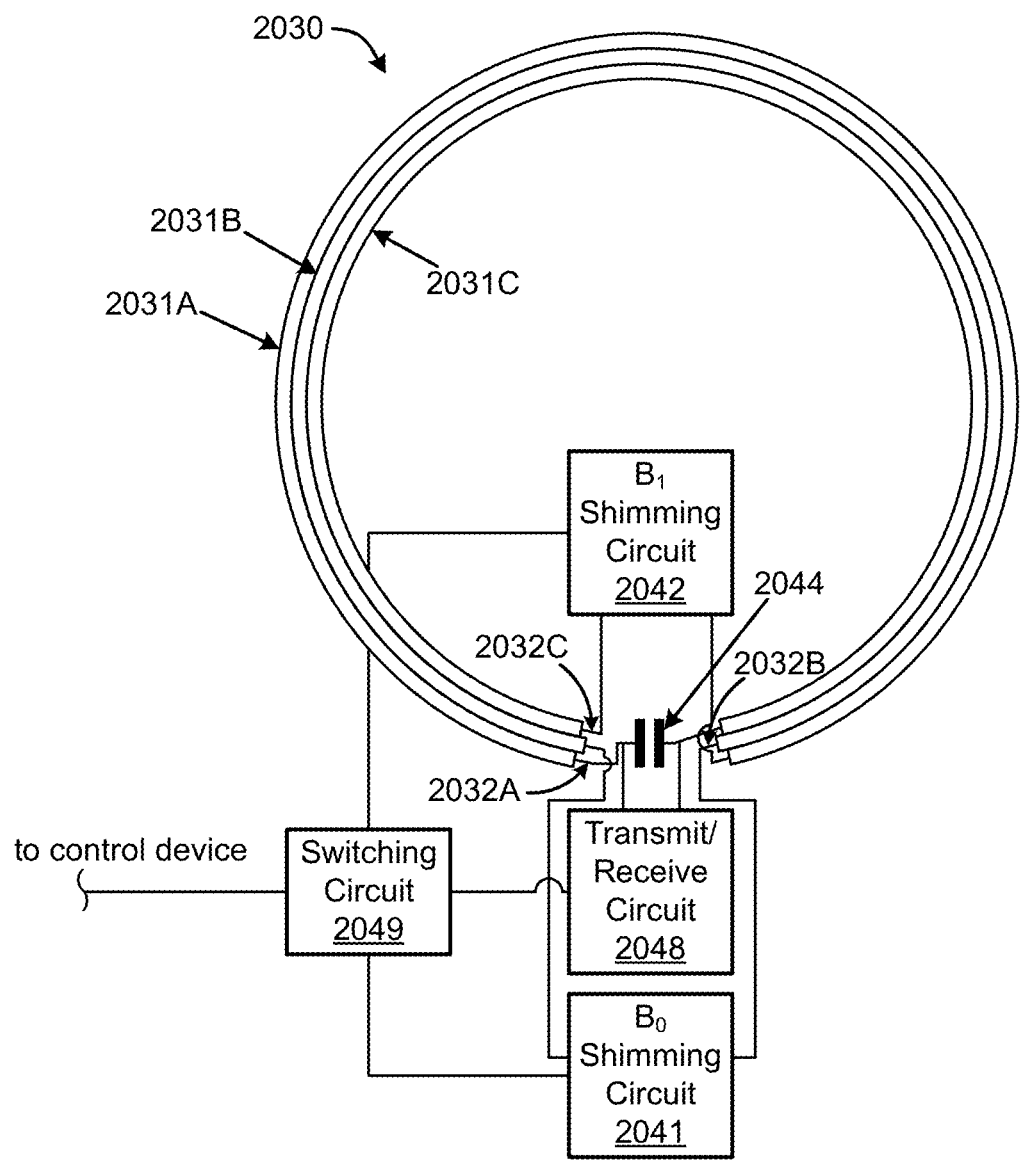
FIG. 20 illustrates an example embodiment of an RF coil.

FIG. 20 illustrates an example embodiment of an RF coil. The RF coil 2030 includes three dielectric-wrapped conductors: a first dielectric-wrapped conductor 2031A, a second dielectric-wrapped conductor 2031B, and a third dielectric-wrapped conductor 2031C. The first dielectric-wrapped conductor 2031A includes a first electrical conductor 2032A, the second dielectric-wrapped conductor 2031B includes a second electrical conductor 2032B, and the third dielectric-wrapped conductor 2031C includes a third electrical conductor 2032C. The ends of the electrical conductors 2032A-C are connected to one or more of the following: a $B_0$ shimming circuit 2041, a $B_1$ shimming circuit 2042, a transmit/receive circuit 2048, and a capacitor 2044. The transmit/receive circuit 2048, which may also implement matching and decoupling circuits, includes circuitry that supplies a voltage or a current that causes the RF coil 2030 to operate as one of the following: a transmit coil, a receive coil, or a transmit-receive coil. Also, a switching circuit 2049 activates and deactivates the $B_0$ shimming circuit 2041, the $B_1$ shimming circuit 2042, and the transmit/receive circuit 2048.

Figure 21A:
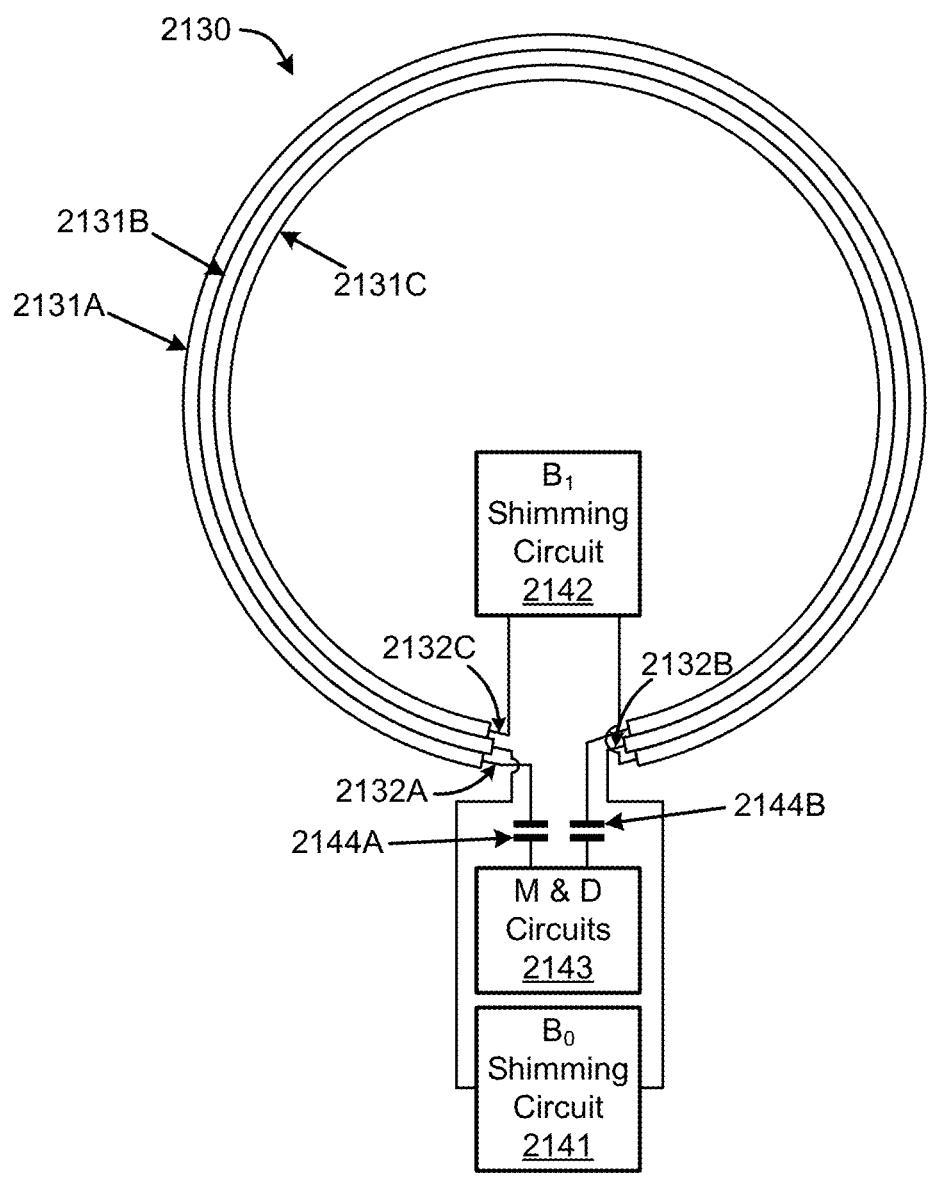
FIG. 21A illustrates an example embodiment of an RF coil.

FIG. 21 illustrates an example embodiment of an RF coil. The RF coil 2130 includes three dielectric-wrapped conductors: a first dielectric-wrapped conductor 2131A, a second dielectric-wrapped conductor 2131B, and a third dielectric-wrapped conductor 2131C. The first dielectric-wrapped conductor 2131A includes a first electrical conductor 2132A, the second dielectric-wrapped conductor 2131B includes a second electrical conductor 2132B, and the third dielectric-wrapped conductor 2131C includes a third electrical conductor 2132C. Each end of the electrical conductors 2132A-C is connected to one of the following: a $B_0$ shimming circuit 2141, a $B_1$ shimming circuit 2142, a first capacitor 2144A, and a second capacitor 2144B. In this embodiment, the matching and decoupling circuits 2143 are connected to the RF coil 2130 via two capacitors 2144A-B, one for each connection to the RF coil 2130. This embodiment of the connection between the RF coil 2130 and the matching and decoupling circuits 2143 can be used with other RF coils, for example the RF coils in FIGS. 3A, 4A, 5A, 6, 7A, 8A, 9A, 10A, 11A, 12A, 13A, 16A, 17A, 18A, and 18B.

Figure 21B:
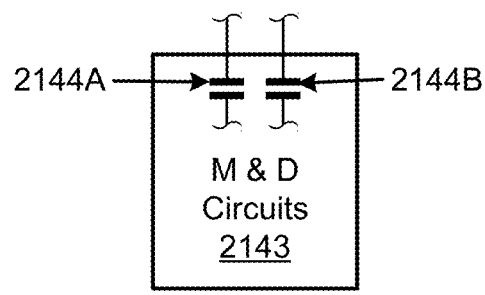
FIG. 21B illustrates an example embodiment of matching and decoupling circuits.

FIG. 21B illustrates an example embodiment of matching and decoupling circuits. In this embodiment, the matching and decoupling circuits 2143 include the first capacitor 2144A and the second capacitor 2144B. Some embodiments of the matching and decoupling circuits 2143 include only one of the first capacitor 2144A and the second capacitor 2144B. And at least one of the first capacitor 2144A and the second capacitor 2144B may be tuning capacitors.

Figure 22A:
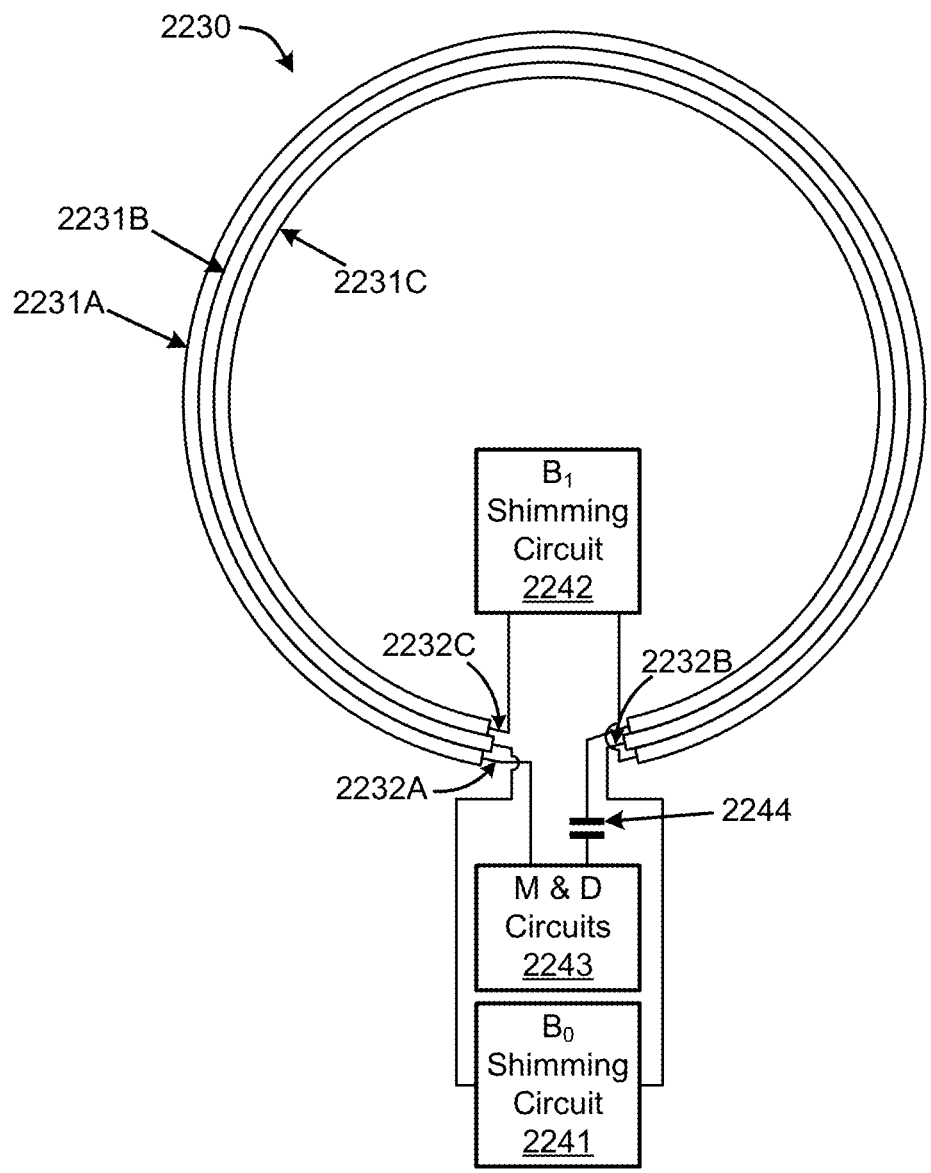
FIG. 22A illustrates an example embodiment of an RF coil.
Figure 22B:
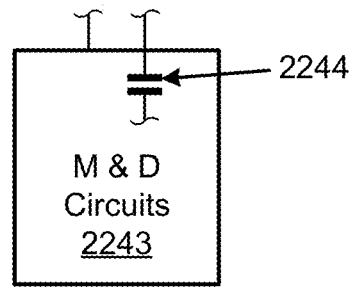
FIG. 22B illustrates an example embodiment of matching and decoupling circuits.

FIG. 22 illustrates an example embodiment of an RF coil. The RF coil 2230 includes three dielectric-wrapped conductors: a first dielectric-wrapped conductor 2231A, a second dielectric-wrapped conductor 2231B, and a third dielectric-wrapped conductor 2231C. The first dielectric-wrapped conductor 2231A includes a first electrical conductor 2232A, the second dielectric-wrapped conductor 2231B includes a second electrical conductor 2232B, and the third dielectric-wrapped conductor 2231C includes a third electrical conductor 2232C. Each end of the electrical conductors 2232A-C is connected to one of the following: a $B_0$ shimming circuit 2241, a $B_1$ shimming circuit 2242, matching and decoupling circuits 2243, and a capacitor 2244. In this embodiment, one connection of the matching and decoupling circuits 2243 to the RF coil 2230 includes the capacitor 2244 between the matching and decoupling circuits 2243 and the RF coil 2230. This embodiment of the connection between the RF coil 2230 and the matching and decoupling circuits 2243 can be used with other RF coils, for example the RF coils in FIGS. 3A, 4A, 5A, 6, 7A, 8A, 9A, 10A, 11A, 12A, 13A, 16A, 17A, 18A, and 18B.

FIG. 21B illustrates an example embodiment of matching and decoupling circuits. In this embodiment, the matching and decoupling circuits 2243 include the capacitor 2244. Also, the capacitor 2244 may be a tuning capacitor.

Figure 23:
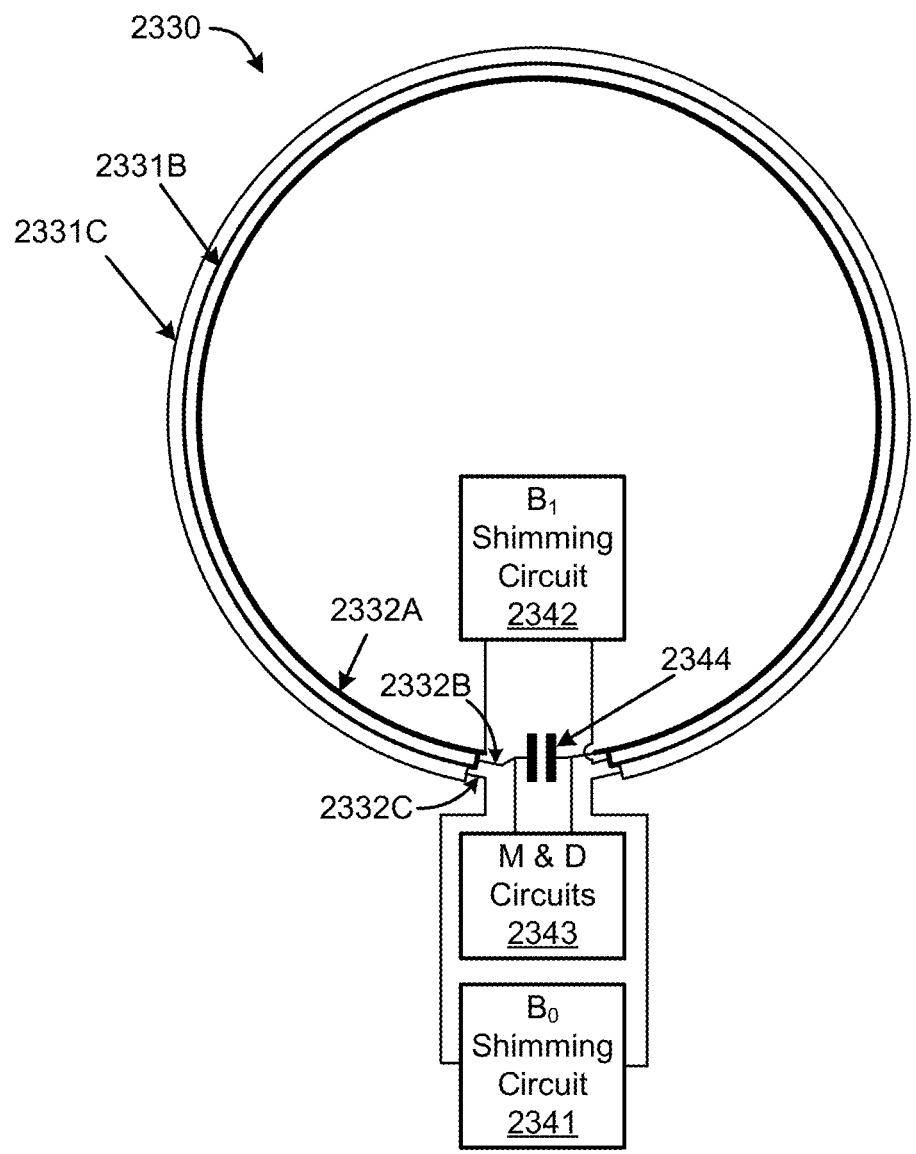
FIG. 23 illustrates an example embodiment of an RF coil.

FIG. 23 illustrates an example embodiment of an RF coil. The RF coil 2330 includes three electrical conductors: a first electrical conductor 2332A, a second electrical conductor 2332B, and a third electrical conductor 2332C. The second electrical conductor 2332B is a member of a first dielectric-wrapped conductor 2331B, and the third electrical conductor 2332C is a member of a second dielectric-wrapped conductor 2331C. The ends of the electrical conductors 2332A-C are connected to one or more of the following: a $B_0$ shimming circuit 2341, a $B_1$ shimming circuit 2342, matching and decoupling circuits 2343, and a capacitor 2344. Also, unlike the embodiment of an RF coil in FIG. 4A, this embodiment does not include an unconnected end.

Figure 24:
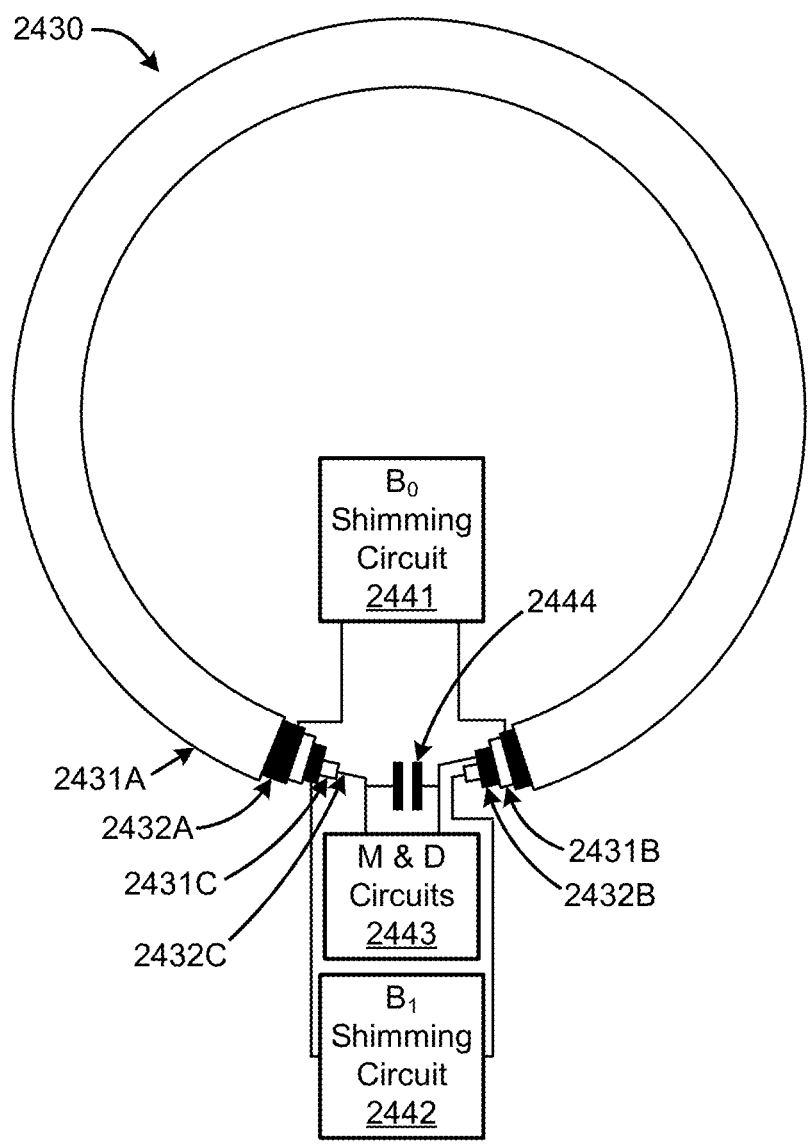
FIG. 24 illustrates an example embodiment of an RF coil.

FIG. 24 illustrates an example embodiment of an RF coil. The RF coil 2430 includes three dielectric-wrapped conductors: a first dielectric-wrapped conductor 2431A, a second dielectric-wrapped conductor 2431B, and a third dielectric-wrapped conductor 2431C. The dielectric-wrapped conductors 2431A-C are arranged in a triaxial configuration. Thus, the first dielectric-wrapped conductor 2431A includes a first electrical conductor 2432A that surrounds the second dielectric-wrapped conductor 2431B and the third dielectric-wrapped conductor 2431C, and the second dielectric-wrapped conductor 2431B includes a second electrical conductor 2432B that surrounds the third dielectric-wrapped conductor 2431C. Accordingly, the three electrical conductors 2432A-C are each immediately surrounded by a respective dielectric material. The ends of the electrical conductors 2432A-C are connected to one or more of the following: a $B_0$ shimming circuit 2441, a $B_1$ shimming circuit 2442, matching and decoupling circuits 2443, and a capacitor 2444. Unlike the embodiment of an RF coil in FIG. 7A, this embodiment does not include an unconnected end.

Figure 25:
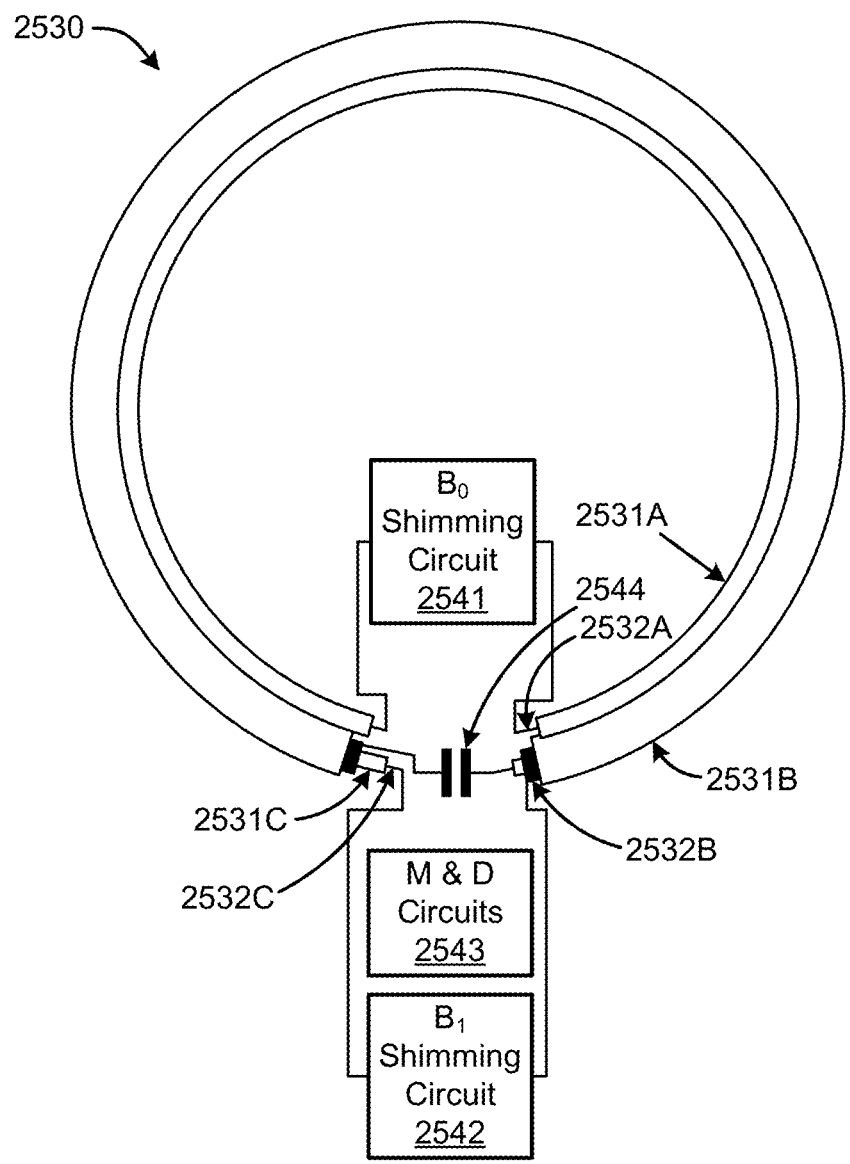
FIG. 25 illustrates an example embodiment of an RF coil.

FIG. 25 illustrates an example embodiment of an RF coil. The RF coil 2530 includes three dielectric-wrapped conductors: a first dielectric-wrapped conductor 2531A, a second dielectric-wrapped conductor 2531B, and a third dielectric-wrapped conductor 2531C. The second dielectric-wrapped conductor 2531B and the third dielectric-wrapped conductor 2531C are arranged in a coaxial configuration. The first dielectric-wrapped conductor 2531A includes a first electrical conductor 2532A, and the second dielectric-wrapped conductor 2531B includes a second electrical conductor 2532B that surrounds the third dielectric-wrapped conductor 2531C. The third dielectric-wrapped conductor 2531C includes a third electrical conductor 2532C. The ends of the electrical conductors 2532A-C are each connected to one of more of the following: a $B_0$ shimming circuit 2541, a $B_1$ shimming circuit 2542, matching and decoupling circuits 2543, and a capacitor 2544. Unlike the embodiment of an RF coil in FIG. 8A, this embodiment does not include an unconnected end.

FIGS. 26A-H illustrate example embodiments of cross-sectional views of RF coils. As illustrated by FIGS. 26A-H, multiple electrical conductors may be enclosed in the same body of dielectric material, which may help to maintain the distances between the electrical conductors at desired distances.

Figure 26A:
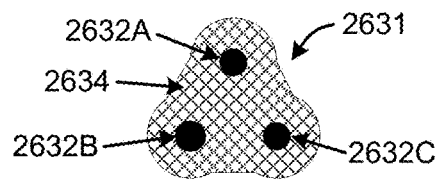
FIGS. 26A-H illustrate example embodiments of cross-sectional views of RF coils.

FIG. 26A illustrates a cross-sectional view of a group of dielectric-wrapped conductors 2631 that includes three electrical conductors 2632A-C that are surrounded by a dielectric material 2634. In this embodiment, in the cross-sectional view, the three electrical conductors 2632A-C form the points of an equilateral or approximate equilateral triangle.

Figure 26B:
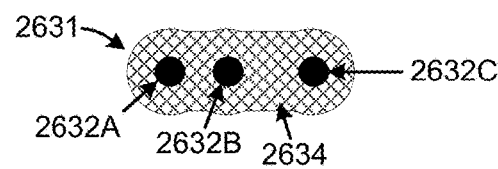

FIG. 26B illustrates a cross-sectional view of a group of dielectric-wrapped conductors 2631 that includes three electrical conductors 2632A-C that are surrounded by a dielectric material 2634. In this embodiment, in the cross-sectional view, the three electrical conductors 2632A-C are aligned in a row in which a second electrical conductor 2632B is closer to a first electrical conductor 2632A than to a third electrical conductor 2632C. And, in the cross-sectional view, the dielectric material 2634 forms an approximate stadium shape (i.e., discorectangle, obround).

Figure 26C:
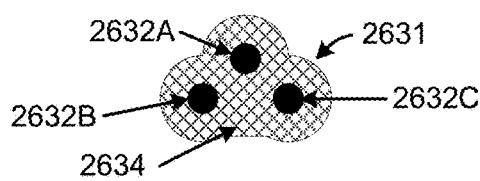

FIG. 26C illustrates a cross-sectional view of a group of dielectric-wrapped conductors 2631 that includes three electrical conductors 2632A-C that are surrounded by a dielectric material 2634. In this embodiment, in the cross-sectional view, the three electrical conductors 2632A-C form the points of an isosceles or an approximate isosceles triangle.

Figure 26D:
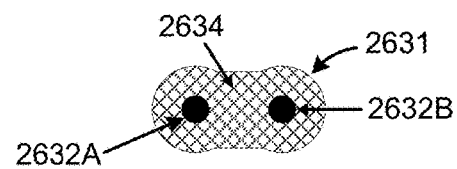

FIG. 26D illustrates a cross-sectional view of a group of dielectric-wrapped conductors 2631 that includes two electrical conductors 2632A-B that are surrounded by a dielectric material 2634. In this embodiment, in the cross-sectional view, the dielectric material 2634 forms an approximate stadium shape.

Figure 26E:
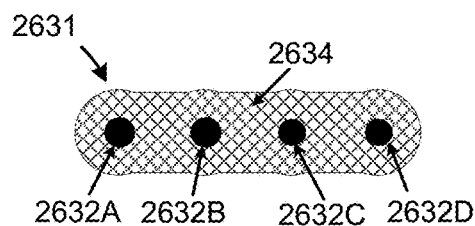

FIG. 26E illustrates a cross-sectional view of a group of dielectric-wrapped conductors 2631 that includes four electrical conductors 2632A-D that are surrounded by a dielectric material 2634. In this embodiment, in the cross-sectional view, the four electrical conductors 2632A-D are aligned in a row in which the four electrical conductors 2632A-D are equally or approximately equally spaced. And, in the cross-sectional view, the dielectric material 2634 forms an approximate stadium shape.

Figure 26F:
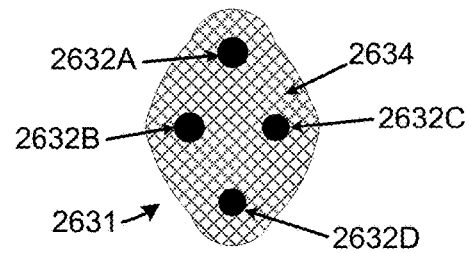

FIG. 26F illustrates a cross-sectional view of a group of dielectric-wrapped conductors 2631 that includes four electrical conductors 2632A-D that are surrounded by a dielectric material 2634. In this embodiment, in the cross-sectional view, the four electrical conductors 2632A-D form the points of a diamond shape. And, in the cross-sectional view, the dielectric material 2634 forms an approximate diamond shape.

Figure 26G:
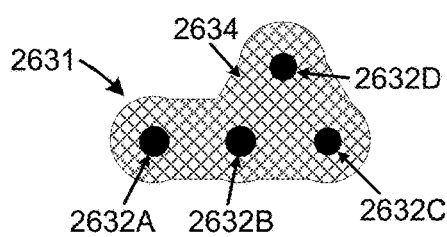

FIG. 26G illustrates a cross-sectional view of a group of dielectric-wrapped conductors 2631 that includes four electrical conductors 2632A-D that are surrounded by a dielectric material 2634. In this embodiment, in the cross-sectional view, the four electrical conductors 2632A-D are arranged such that they form an approximate ᑭ shape, where three of the electrical conductors 2632B-C form the points of a triangle. And, in the cross-sectional view, the dielectric material 2634 forms an approximate ᑭ shape.

Figure 26H:
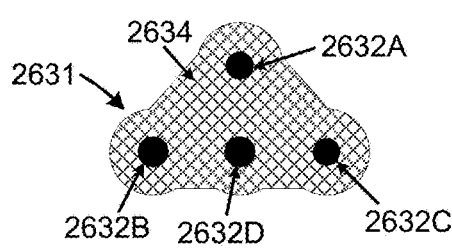

FIG. 26H illustrates a cross-sectional view of a group of dielectric-wrapped conductors 2631 that includes four electrical conductors 2632A-D that are surrounded by a dielectric material 2634. In this embodiment, in the cross-sectional view, three of the electrical conductors 2632A-C form the points of a diamond shape, and one of the electrical conductors 2632D is located between two of the electrical conductors 2632B-C on the base of the triangle. Also, in the cross-sectional view, the dielectric material 2634 forms an approximate triangle shape.

As used herein, the conjunction "or" generally refers to an inclusive "or," though "or" may refer to an exclusive "or" if expressly indicated or if the context indicates that the "or" must be an exclusive "or."

The invention claimed is:

1. A radio-frequency coil comprising:
two or more electrical conductors that form a radio-frequency coil element, wherein the two or more electrical conductors include a first electrical conductor and a second electrical conductor; and
a plurality of dielectric members,
wherein, along at least part of a length of the radio-frequency coil element, the first electrical conductor and the second electrical conductor are separated by at least two of the plurality of dielectric members.

2. The radio-frequency coil of claim 1, wherein the plurality of dielectric members include a first dielectric member and a second dielectric member,
wherein, along the at least part of the length of the radio-frequency coil element, the first electrical conductor is jacketed in the first dielectric member, and
wherein, along the at least part of the length of the radio-frequency coil element, the second electrical conductor is jacketed in the second dielectric member.

3. The radio-frequency coil of claim 2, wherein, along the at least part of the length of the radio-frequency coil element, the first electrical conductor is not jacketed in any dielectric member, of the plurality of dielectric members, other than the first dielectric member, and
wherein, along the at least part of the length of the radio-frequency coil element, the second electrical conductor is not jacketed in any dielectric member, of the plurality of dielectric members, other than the second dielectric member.

4. The radio-frequency coil of claim 2, wherein the first electrical conductor and the first dielectric member are intertwined with the second electrical conductor and the second dielectric member.

5. The radio-frequency coil of claim 2, wherein the first electrical conductor does not contact any dielectric member, of the plurality of dielectric members, other than the first dielectric member, and
wherein the second electrical conductor does not contact any dielectric member, of the plurality of dielectric members, other than the second dielectric member.

6. The radio-frequency coil of claim 2, wherein the first dielectric member is composed of a first dielectric material, wherein the second dielectric member is composed of a second dielectric material, and wherein the first dielectric material has a respective relative permittivity that is different from a respective relative permittivity of the second dielectric material.

7. The radio-frequency coil of claim 1, wherein the plurality of dielectric members include a respective dielectric member for each of the two or more electrical conductors.

8. The radio-frequency coil of claim 1, wherein the length of the radio-frequency coil element, respective distances between the two or more electrical conductors, and the plurality of dielectric members are configured such that the radio-frequency coil element is configured for $B_0$ shimming or $B_1$ shimming.

9. The radio-frequency coil of claim 8, wherein the length of the radio-frequency coil element, the respective distances between the two or more electrical conductors, and the plurality of dielectric members are configured such that the radio-frequency coil element is configured for both $B_0$ shimming and $B_1$ shimming.

10. The radio-frequency coil of claim 1,
wherein the first electrical conductor is configured to be connected to a first shimming circuit; and
wherein the second electrical conductor is configured to be connected to a second shimming circuit.

11. The radio-frequency coil of claim 1, wherein the two or more electrical conductors include three or more electrical conductors, and wherein the three or more electrical conductors and the plurality of dielectric members are arranged in a twinaxial cable.

12. The radio-frequency coil of claim 1, wherein the two or more electrical conductors include three or more electrical conductors, and wherein the three or more electrical conductors and the plurality of dielectric members are arranged in a triaxial cable.

13. The radio-frequency coil of claim 1, wherein the two or more electrical conductors include three or more electrical conductors,
   wherein at least two of the three or more electrical conductors are arranged in a coaxial cable, and
   wherein at least one of the three or more electrical conductors is not arranged in the coaxial cable.

14. The radio-frequency coil of claim 1, wherein the two or more electrical conductors include flexible printed circuit boards.

15. A radio-frequency coil comprising:
   two or more electrical conductors that form a coil, wherein the two or more electrical conductors include a first electrical conductor and a second electrical conductor; and
   a plurality of dielectric materials,
   wherein, along at least part of a length of the coil, the first electrical conductor is separated from the second electrical conductor by at least two dielectric materials of the plurality of dielectric materials, and
   wherein the at least two dielectric materials include a first dielectric material and a second dielectric material, wherein the first dielectric material has a respective relative permittivity that is different from a respective relative permittivity of the second dielectric material.

16. The radio-frequency coil of claim 15, wherein, along at least a part of a length of the first electrical conductor, the first electrical conductor is jacketed in the first dielectric material, and
   wherein, along at least a part of a length of the second electrical conductor, the second electrical conductor is jacketed in the second dielectric material.

17. The radio-frequency coil of claim 15, wherein, along the at least part of the length of the coil, the first dielectric material abuts the second dielectric material.

18. The radio-frequency coil of claim 15, wherein the length of the coil and the two or more dielectric materials are configured such that the coil is configured to generate a magnetic field for $B_0$ shimming or to generate a magnetic field for $B_1$ shimming.

19. The radio-frequency coil of claim 15, wherein the two or more electrical conductors include three or more electrical conductors.

20. A radio-frequency circuit comprising:
   two or more electrical conductors; and
   one or more dielectric members,
   wherein the two or more electrical conductors and the one or more dielectric members form a radio-frequency coil element,
   wherein, along at least part of a length of the radio-frequency coil element, the two or more electrical conductors are separated from each other by the one or more dielectric members, and
   wherein the radio-frequency coil element is configured to generate a magnetic field for $B_0$ shimming or to generate a magnetic field for $B_1$ shimming.

21. The radio-frequency circuit of claim 20, further comprising:
   a $B_0$ shimming circuit,
   wherein at least one of the two or more electrical conductors is connected to the $B_0$ shimming circuit.

22. The radio-frequency circuit of claim 20, further comprising:
   a $B_1$ shimming circuit,
   wherein at least one of the two or more electrical conductors is connected to the $B_1$ shimming circuit.

23. A radio-frequency coil device, comprising:
   an array of radio-frequency coils, wherein each radio-frequency coil of the array of radio-frequency coils respectively comprises:
     two or more electrical conductors that form a radio-frequency coil element,
   wherein the two or more electrical conductors include a first electrical conductor and a second electrical conductor; and
   a plurality of dielectric members,
     wherein, along at least part of a length of the radio-frequency coil element, the first electrical conductor and the second electrical conductor are separated by at least two of the plurality of dielectric members.

* * * * *